US012757388B2

(12) United States Patent
Song et al.

(10) Patent No.: US 12,757,388 B2
(45) Date of Patent: Oct. 6, 2026

(54) WORD-LINE-PICKUP STRUCTURE AND METHOD FOR FORMING THE SAME

(71) Applicant: YANGTZE MEMORY TECHNOLOGIES CO., LTD., Wuhan (CN)

(72) Inventors: Dongmen Song, Wuhan (CN); Fandong Liu, Wuhan (CN); Wenxiang Xu, Wuhan (CN); Mingli Du, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 469 days.

(21) Appl. No.: 18/229,702

(22) Filed: Aug. 3, 2023

(65) Prior Publication Data

US 2024/0032285 A1 Jan. 25, 2024

Related U.S. Application Data

(63) Continuation of application No. PCT/CN2023/106319, filed on Jul. 7, 2023.

(Continued)

(51) Int. Cl.
*H10B 12/00* (2023.01)

(52) U.S. Cl.
CPC ........... *H10B 12/488* (2023.02); *H10B 12/05* (2023.02)

(58) Field of Classification Search
CPC ... H10B 12/488; H10B 12/05; H10W 20/021; G11C 8/14; G11C 11/408
See application file for complete search history.

(56) References Cited

U.S. PATENT DOCUMENTS

2018/0114794 A1 4/2018 Jang et al.
2018/0226408 A1* 8/2018 Feng .................... H10B 12/482

(Continued)

FOREIGN PATENT DOCUMENTS

| | | | |
|---|---|---|---|
| CN | 107680969 A | | 2/2018 |
| CN | 112349720 | * | 2/2021 |
| KR | 20190075682 A | | 7/2019 |

OTHER PUBLICATIONS

International Search Report issued in corresponding International Application No. PCT/CN2023/106319, mailed Oct. 12, 2023, 3 pages.

(Continued)

*Primary Examiner* — Yasser A Abdelaziez
(74) *Attorney, Agent, or Firm* — BAYES PLLC

(57) ABSTRACT

A memory device, having a plurality of first-word-lines, each first-word-line having a first portion, a second portion, and a third portion; a plurality of second-word-lines, each second-word-line having a first portion, a second portion, and a third portion; and a memory array having a first side, a second side laterally opposite the first side, and a third side. The first portions of each first-word-line and each second-word-line are spaced apart from their respective third portions. The second portion of each first-word-line and the second portion of each second-word-line are non-parallel and non-co-linear with their respective first portions and third portions. Each first-word-line is disposed such that its second portion is adjacent to the first side, and each second-word-line is disposed such that its second portion is adjacent to the second side. The memory device further has a plurality of first-side-word-line-pickup-structures, and a plurality of second-side-word-line-pickup-structures.

20 Claims, 18 Drawing Sheets

Related U.S. Application Data

(60) Provisional application No. 63/391,280, filed on Jul. 21, 2022.

(56) References Cited

U.S. PATENT DOCUMENTS

| | | | | |
|---|---|---|---|---|
| 2019/0164985 | A1* | 5/2019 | Lee | H10B 41/27 |
| 2021/0358916 | A1 | 11/2021 | Liu | |
| 2022/0122984 | A1* | 4/2022 | Tung | H10B 12/34 |
| 2023/0048424 | A1* | 2/2023 | Kim | H10B 12/30 |
| 2023/0065806 | A1* | 3/2023 | Zhu | H10W 90/00 |

OTHER PUBLICATIONS

Extended European Search Report issued in corresponding European Application No. 23842142.4, mailed Sep. 26, 2025, 12 pages.

* cited by examiner

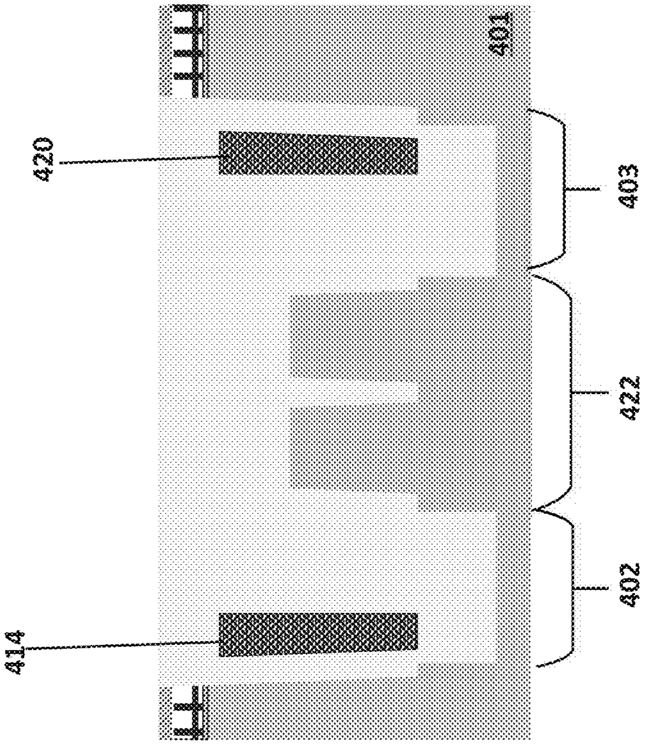
FIG. 4G
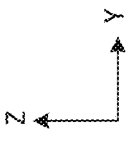

500C

WORD-LINE-PICKUP STRUCTURE AND METHOD FOR FORMING THE SAME

CROSS-REFERENCE TO RELATED APPLICATIONS

This application is a continuation of International Application No. PCT/CN2023/106319, filed on Jul. 7, 2023, and entitled "WORD-LINE-PICKUP STRUCTURE AND METHOD FOR FORMING THE SAME," which claims the benefit of priority to U.S. Provisional Application No. 63/391,280, filed on Jul. 21, 2022, and entitled "Word Line Pickup Structure and Method for Forming the Same," both of which are incorporated herein by reference in their entireties.

BACKGROUND

The present disclosure relates to integrated circuits in general, and more particularly to the shape and arrangement of conductive lines.

Various advances in semiconductor manufacturing technologies have provided the ability to produce smaller and smaller feature sizes, and smaller and smaller spaces between those features. However, these smaller features and spacings continue to present manufacturing challenges and yield problems.

SUMMARY

According to one aspect of the present disclosure, a memory device, includes a plurality of first-word-lines, wherein each first-word-line has a first portion, a second portion, and a third portion; a plurality of second-word-lines, wherein each second-word-line has a first portion, a second portion, and a third portion; and a memory array having a first side, a second side laterally opposite the first side, and a third side; wherein the first portion of each first-word-line is spaced apart from its third portion, and the first portion of each second-word-line is spaced apart from its third portion, the second portion of each first-word-line is non-parallel and non-co-linear with its first portion and its third portion, and the second portion of each second-word-line is non-parallel and non-co-linear with its first portion and its third portion, each first-word-line is disposed such that its second portion is adjacent to the first side, and each second-word-line is disposed such that its second portion is adjacent to the second side, the first portion of each first-word-line has a first length, the second portion of each first-word-line has a second length, and the third portion of each first-word-line has a third length, the first portion of each second-word-line has a fourth length, the second portion of each second-word-line has a fifth length, and the third portion of each second-word-line has a sixth length, the first length is greater than the third length, and the fourth length is greater than the sixth length.

In some implementations, the second portion of each first-word-line is disposed within a first predetermined distance of the first side and a second predetermined distance of the second side, the first predetermined distance being less than the second predetermined distance, the second portion of each second-word-line is disposed within a third predetermined distance of the second side and a fourth predetermined distance of the first side, the third predetermined distance being less than the fourth predetermined distance, the third portion of a first first-word-line is a first distance from the third side, and the first portion of a first second-word-line is the first distance from the third side, the third portion of a second first-word-line is a second distance from the third side, and the first portion of a second second-word-line is the second distance from the third side, the first portion of each first-word-line extends vertically to form one or more vertically-oriented gate electrodes, the first portion of each second-word-line extends vertically to form one or more vertically-oriented gate electrodes.

In some implementations, the memory device further includes a plurality of first-side-word-line-pickup-structures, and a plurality of second-side-word-line-pickup-structures; wherein each first-side-word-line-pickup-structure comprises at least the second portion of a corresponding first-word-line, a section of the first portion of the corresponding first word-line, and a section of the third portion of the corresponding first word-line, wherein each second-side-word-line-pickup-structure comprises at least the second portion of a corresponding second-word-line, a section of the first portion of the corresponding second word-line, and a section of the third portion of the corresponding second word-line.

In some implementations, the memory device further includes a first plurality of contact structures, and a second plurality of contact structures, wherein each contact structure of the first plurality of contact structures is disposed at a corresponding first-side-word-line-pickup-structure, and each contact structure of the second plurality of contact structures is disposed at a corresponding second-side-word-line-pickup-structure.

In some implementations, the first portion of the first first-word-line is parallel to a first portion of the first second-word-line.

In some implementations, the first portion of each first-word-line extends laterally, away from the first side of the memory array and towards the second side of the memory array.

In some implementations, the memory device further includes a first plurality of rows of memory cells, each row of the first plurality of rows of memory cells having a plurality of memory cells, wherein the first portion of each first word line is coupled to the plurality of memory cells of a corresponding row of the first plurality of rows of memory cells.

In some implementations, the first portion of each second-word-line extends laterally away from the second side of the memory array and towards the first side of the memory array.

In some implementations, the memory device further includes a second plurality of rows of memory cells, each row of the second plurality of rows of memory cells having a plurality of memory cells, wherein the first portion of each second-word-line is coupled to the plurality of memory cells of a corresponding row of the second plurality of rows of memory cells.

In some implementations, the third portion of each first-word-line extends away from the first side of the memory array and towards the second side of the memory array, and the third portion of each second-word-line extends away from the second side of the memory array and towards the first side of the memory array.

According to another aspect of the present disclosure, a memory device includes a memory array having a first side, a second side opposite the first side, and a third side, a first-word-line, at least partially disposed within the memory array, having a first portion, a second portion, and a third portion, wherein the first portion, the second portion, and the third portion, of the first-word-line are continuous with each other, a second-word-line, at least partially disposed within the memory array, having a first portion, a second portion, and a third portion, wherein the first portion, the second portion, and the third portion, of the second-word-line are continuous with each other; and a first-side-word-line-pickup-structure comprising the second portion of the first-word-line, a section of the first portion of the first-word-line, and a section of the third portion of the first-word-line, wherein the first portion and the third portion of the first-word-line are spaced apart from each other, and the first portion and the third portion of the second-word-line are spaced apart from each other.

In some implementations, the first portion of the first-word-line is longer than the third portion of the first-word-line, the first portion of the second-word-line is longer than the third portion of the second-word-line, and the first-word-line and the second-word-line are disposed such that the first portion of the first-word-line, the third portion of the first-word-line, the first portion of the second-word-line, and the third portion of the second-word-line are all parallel to each other.

In some implementations, the first-word-line and the second-word-line are disposed such that the first portion of the first-word-line is a first distance from the third side of the memory array, and the third portion of the second-word-line is the first distance from the third side of the memory array, and the third portion of the first-word-line is a second distance from the third side of the memory array, and the first portion of the second-word-line is the second distance from the third side of the memory array.

In some implementations, the memory device further includes a third-word-line having a first portion, a second portion, and a third portion, wherein the first portion, the second portion, and the third portion, of the third-word-line are continuous with each other; and a fourth-word-line having a first portion, a second portion, and a third portion, wherein the first portion, the second portion, and the third portion, of the fourth-word-line are continuous with each other, wherein the first portion of the first-word-line is adjacent to the first portion of the second-word-line in a bit-line direction, the first portion of the second-word-line is adjacent to the first portion of the third-word-line in the bit-line direction, and the first portion of the third-word-line is adjacent to the first portion of the fourth-word-line in the bit-line direction.

In some implementations, the memory device further includes a third-word-line having a first portion, a second portion, and a third portion, wherein the first portion, the second portion, and the third portion, of the third-word-line are continuous with each other; and a fourth-word-line having a first portion, a second portion, and a third portion, wherein the first portion, the second portion, and the third portion, of the fourth-word-line are continuous with each other; wherein the first portion of the first-word-fine is adjacent to the first portion of the second-word-line in a bit-line direction, the first portion of the first-word-line is adjacent to the first portion of the third-word-line in the bit-line direction, and the first portion of the third-word-line is adjacent to the first portion of the fourth-word-line in the bit-line direction.

According to a further aspect of the present disclosure, a semiconductor device includes a memory array having a first side, a second side opposite the first side, and a third side, and including a plurality of memory rows, each memory row including a plurality of memory cells; a first-word-line, wherein the first-word-line has a first portion, a second portion, and a third portion, the second portion of the first-word-line being disposed closer to the first side than to the second side, the first portion and the third portion being spaced apart from each other, and the first-word-line coupled to the plurality of memory cells of a first memory row; a second-word-line, wherein the second-word-line has a first portion, a second portion, and a third portion, the second portion of the second-word-line being disposed closer to the second side than to the first side, the first portion and the third portion being spaced apart from each other, and the second-word-line coupled to the plurality of memory cells of a second memory row; a third-word-line, wherein the third-word-line has a first portion, a second portion, and a third portion, the second portion of the third-word-line being disposed closer to the first side than to the second side, the first portion and the third portion being parallel to each other, and the third-word-line coupled to the memory cells of a third memory row; and a fourth-word-line, wherein the fourth-word-line has a first portion, a second portion, and a third portion, the second portion of the fourth-word-line being disposed closer to the second side than to the first side, the first portion and the third portion being parallel to each other, and the fourth-word-line coupled to the memory cells of a fourth memory row.

In some implementations, the first-word-line, the second-word-line, and the third-word-line are disposed such that the first portion of the first-word-line is adjacent to the first portion of the second-word-line, and also adjacent to the third-word-line.

In some implementations, the third portion of the first-word-line is the same distance from the third side of the memory array as the first portion of the second-word-line.

In some implementations, the first-word-line, the second-word-line, and the third-word-line are disposed such that the first portion of the second-word-line is adjacent to the first portion of the first-word-line, and also adjacent to the first portion of the third-word-line.

In some implementations, the third portion of the second-word-line is the same distance from the third side of the memory army as the first portion of the first-word-line.

According to a further aspect of the present disclosure, a method of forming a semiconductor structure includes etching a first trench and a second trench in a semiconductor substrate, the first trench having a first trench-sidewall and a second trench-sidewall, the second trench having a first trench-sidewall and a second trench-sidewall, forming at least one first vertically-oriented transistor disposed in the first trench, and at least one second vertically-oriented transistor disposed in the second trench, patterning a layer of conductive material such that a plurality of word lines are formed, each word line having a first portion, a second portion non-parallel and non-co-linear with the first portion, and a third portion spaced apart from the first portion, forming a gap between the first vertically-oriented transistor and the second vertically-oriented transistor, and filling the gap with at least one dielectric material.

In some implementations, forming the gap includes removing a portion of the semiconductor substrate disposed between the first trench and the second trench.

In some implementations, the method further includes patterning the layer of conductive material such that a first set of the plurality of word lines have their corresponding second portions disposed at a first side of a memory array, and a second set of the plurality of word lines have their corresponding second portions disposed at a second side of the memory array.

In some implementations, the second portions of the first set of the plurality of word lines are parallel to the second portions of the second set of the plurality of word lines.

In some implementations, the first set of the plurality of word lines and the second set of the plurality of word lines are disposed alternatingly with each other.

In some implementations, the method further includes forming word line pickups at each second portion of the plurality of word lines.

In some implementations, the conductive material includes at least one metal.

In some implementations, the first trench includes a first trench-bottom, the second trench includes a second trench-bottom, and the method further includes removing a first portion of the layer of conductive material above the first trench-bottom, and removing a second portion of the layer of conductive material above the second trench-bottom.

In some implementations, the method further includes planarizing the at least one dielectric material.

In some implementations, the at least one dielectric material comprises at least an oxide of silicon.

According to a further aspect of the present disclosure, a method of forming a semiconductor structure includes providing a substrate having a top surface and a bottom surface, etching at least a first trench and a second trench into the substrate, the first and second trenches each having at least a first trench-sidewall, a second trench-sidewall, and a trench-bottom, wherein a substrate structure disposed between the first trench and the second trench provides the second trench-sidewall for the first trench and the first trench-sidewall for the second trench, forming a first dielectric layer adjacent to the first trench-sidewall, second trench-sidewall, and trench-bottom of the first trench, and adjacent to the first trench-sidewall, second trench-sidewall, and trench-bottom of the second trench, forming a layer of conductive material having a first surface and a second surface opposite the first surface, wherein a first portion of the first surface is adjacent to the first dielectric layer, and the second surface of the layer of conductive material is disposed such that there is a first gap between the second surface of the conductive material disposed on the first trench-sidewall of the first and second trenches, and the second surface of the conductive material disposed on the corresponding second trench-sidewall of the first and second trenches, removing a first portion of the layer of conductive material from each trench such that a portion of the first dielectric layer, disposed on the trench-bottom of the first and second trenches, is exposed, filling the first gap of the first and second trenches with a second dielectric layer, removing an upper portion of the second dielectric layer, an upper portion of the layer of conductive material disposed on the first trench-sidewall of each trench, and an upper portion of the layer of conductive material disposed on the second trench-sidewall of the first and second trenches, whereby a second gap is formed in an upper portion of the first and second trenches, filling the second gap in the upper portion of the first and second trenches with a third dielectric layer, and forming a third gap by removing a first portion of third dielectric layer in the first trench, a second portion of the third dielectric layer in the second trench, a first lower portion of the layer of conductive material in the first trench, a second lower portion of the layer of conductive material in the second trench, and an upper portion of the substrate structure.

In some implementations, the second dielectric layer and the third dielectric layer both comprise a first dielectric material.

In some implementations, the first dielectric material includes an oxide of silicon.

In some implementations, the method further includes patterning the layer of conductive material such that a plurality of word lines are formed, each word line having a first portion, a second portion perpendicular to the first portion, and a third portion perpendicular to the second portion, and parallel to the third portion.

In some implementations, the method further includes patterning the layer of conductive material such that a first set of the plurality of word lines have their corresponding second portions disposed at a first side of a memory array to provide a plurality of first-side-word-line-pickup-structures, and a second set of the plurality of word lines have their corresponding second portions disposed at a second side of the memory array to provide a plurality of second-side-word-line-pickup-structures.

According to a further aspect of the present disclosure, a method of forming word lines for a memory array includes providing a semiconductor substrate, the semiconductor substrate having a top surface, etching a plurality of trenches including at least a first trench and a second trench, wherein the first trench has a first trench-sidewall, a second trench-sidewall, and a trench-bottom, and the second trench has a first trench-sidewall, a second trench-sidewall, and a trench-bottom, disposing a first dielectric layer on the first trench-sidewall, the second trench-sidewall, and the trench-bottom of the first trench, and further disposing the first dielectric layer on the first trench-sidewall, the second trench-sidewall, and the trench-bottom of the second trench, forming a patterned layer of metal such that a plurality of word lines are formed in the memory array, each word line of the plurality of word lines having a first portion, a second portion disposed at a first angle to the first portion, and a third portion spaced apart from the first portion, and disposed at a second angle to the second portion, and patterning the patterned layer of metal such that portions of the patterned layer of metal above the trench-bottoms are removed, wherein a first set of the plurality of word lines have their corresponding second portions disposed at a first side of a memory array, and a second set of the plurality of word lines have their corresponding second portions disposed at a second side of the memory array.

In some implementations, a semiconductor structure, disposed between the first trench and the second trench, forms the second trench-sidewall of the first trench, and forms the first trench-sidewall of the second trench.

In some implementations, the method further includes removing an upper portion of the semiconductor structure.

In some implementations, the method further includes forming, prior to etching the plurality of trenches, a silicon nitride layer on the top surface of the semiconductor substrate, patterning the silicon nitride layer, forming at least one vertically-oriented gate electrode in the first trench, and at least one vertically-oriented gate electrode in the second trench, and removing, prior to removing an upper portion of the semiconductor structure, a portion of the silicon nitride layer that is disposed on the semiconductor structure.

In some implementations, the method further includes depositing a third dielectric layer above at least a lower portion of the semiconductor structure.

These illustrative implementations are mentioned not to limit or define the present disclosure, but to provide examples to aid understanding thereof. Additional implementations are discussed in the Detailed Description, and further description is provided there.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use implementations of the present disclosure.

FIG. 4G is a cross-sectional view of an illustrative seventh intermediate structure formed after a dielectric deposition and a planarization operation have been performed on the sixth intermediate structure in accordance with this disclosure.

FIG. 513 is a top view of the structure of FIG. 5A after a dielectric deposition in accordance with this disclosure.

Figure 1C:
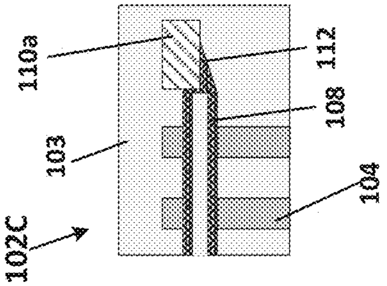
FIG. 1C is a top view showing a failure mechanism where two word lines are shorted together at a word-line-pickup-structure.

The present disclosure will be described with reference to the accompanying drawings.

DETAILED DESCRIPTION

Many types of memory use a physical layout architecture in which a memory array includes word lines and bit lines. Word lines are typically connected to word line driver circuits. The connection between a word line and its corresponding word line driver circuit typically includes a contact structure. The physical layout of that portion of a word line at which the contact structure is disposed may be referred to as a word-line-pickup-structure, and the area at which the contact structure is disposed may be referred to as a word-line-pickup-location. Word-line-pickup-structures in accordance with this disclosure may be applied to various types of memory, such as, but not limited to, dynamic random access memory (DRAM), static random access memory (SRAM), flash memory, phase-change memory, ferroelectric memory, and so on.

In some approaches, the physical layout architecture of a memory array includes a plurality of word-lines shaped as line segments, and a contact structure disposed on each word line at a first side of the memory array. With all the contact structures disposed at a first side of the memory array, the distance between two adjacent contact structures is small, especially in high-density devices. In this arrangement, short circuits are more likely to occur because of the very close spacing. In turn, reducing the risk of short circuits in such layouts increases the difficulty of the semiconductor manufacturing process.

In other approaches, the physical layout architecture of a memory array includes a plurality of word-lines shaped as line segments, and an arrangement where a first contact structure is disposed on a word-line at a first side of the memory array, and a second contact structure is disposed on an adjacent word-line, at a second side of the memory array, with this alternating arrangement repeated over the word-lines in the memory array. While this "staggered" arrangement of contact structures, i.e., word-line-pickup-structures, may reduce the short circuit problem to some extent, there is still an issue with the closely spaced word-lines being shorted together with on word-line-pickup-structure effectively connected to two adjacent word-lines. To reduce, or eliminate, the risk of a word-line-pickup-structure being shorted to a second word-line may require further processing, which is complicated and increases manufacturing costs.

Various illustrative examples and implementations are presented herein to facilitate the understanding of the structures of, and methods for producing, a word line pickup in memories in accordance with the present disclosure.

It is noted that references in the specification to "one implementation." "an implementation," "an example implementation," "some implementation," etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to effect such feature, structure or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. Terms used herein to describe various shapes, sizes, distances, or directions that are subject to manufacturing tolerances should be understood to be nominal unless specifically stated otherwise.

As used herein, the term "vertical/vertically" means nominally perpendicular to the lateral surface of the laterally-oriented substrate.

As used herein, the acronym "CMOS" refers to Complementary Metal Oxide Semiconductor. "CMOS process" refers to a semiconductor manufacturing process that produces both n-channel field effect transistors and p-channel field effect transistors on the same substrate. "CMOS circuit" refers to an electrical circuit that includes both an n-channel field effect transistor and a p-channel field effect transistor.

Figure 1B:
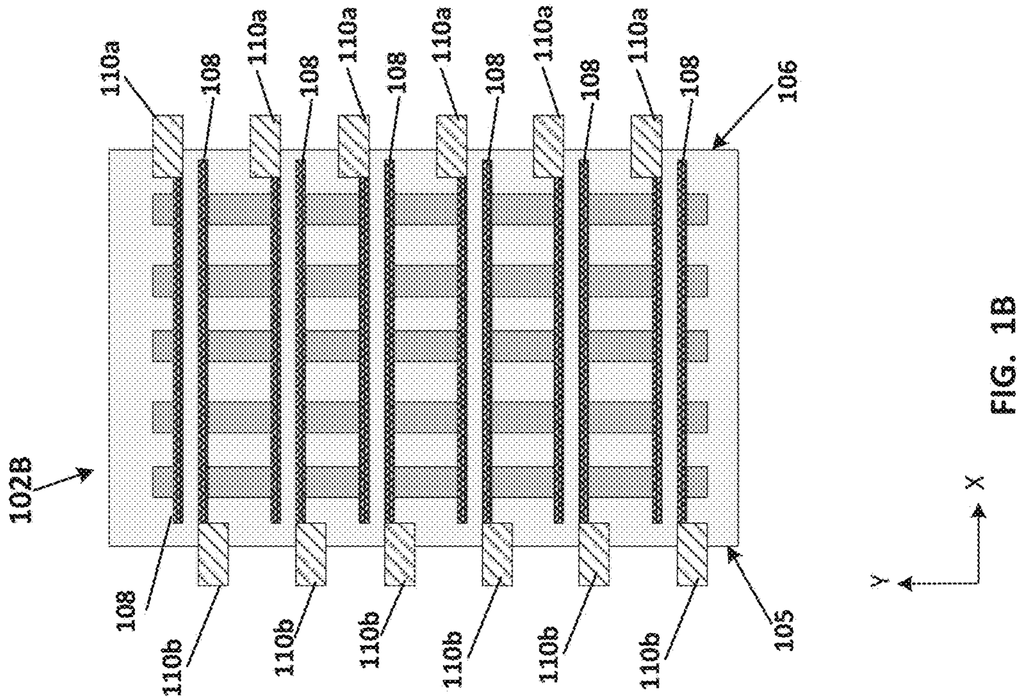
FIG. 1B is a top view of a memory array having an alternative arrangement of word-line-pickup-locations and contact structures.
Figure 1A:
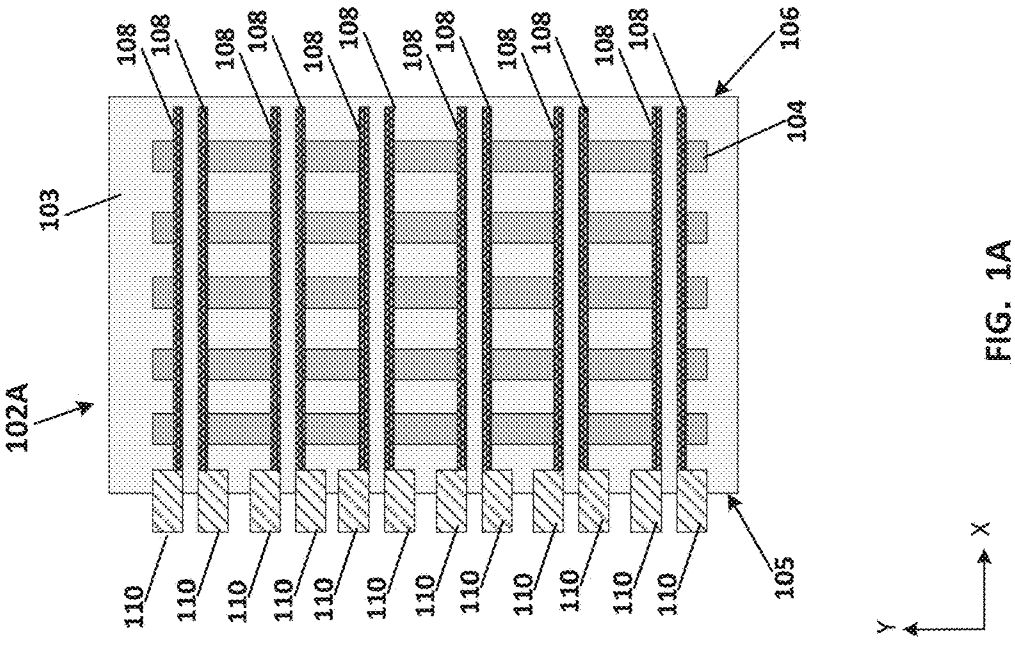
FIG. 1A is a top view of a memory array having a plurality of word lines, each word line having a word-line-pickup-structure on a same side of the memory array and contact structure disposed at each word-line-pickup-structure.

FIGS. 1A-1C illustrate word line arrangements and help to explain some of the manufacturing challenges associated with those previously used word line arrangements.

FIG. 1A is a top view of a memory array 102A including a dielectric area 103, and silicon area 104. Memory array 102A has a first side 105 and a second side 106. Memory array 102A has a plurality of word lines 108, and a corresponding plurality of contact structures 110. In memory array 102A, one contact structure 110 is disposed on each word line 108 at first side 105 of memory array 102A. The area where each contact structure 110 is disposed on each corresponding word line 108 is referred to herein as a word-line-pickup-location.

FIG. 1B is a top view of a memory array 102B having an alternative arrangement of word-line-pickup-locations and contact structures. Memory array 102B has a first side 105 and a second side 106. Memory array 102B further has a plurality of word lines 108, each word line having a word-line-pickup-location where it connects to a contact structure 110*a* on the second side 106 of memory array 102B, or to a contact structure 110*b* on the first side 105 of memory array 102B.

FIG. 1C is a top view of a portion of a memory array 102C showing a failure mechanism where two word lines 108 are shorted together with an undesired piece of a conductor 112. Such a short between word lines may render an integrated circuit unsuitable for use in its intended application.

As noted above, FIGS. 1A-1C illustrate various manufacturing challenges and problems that may occur in some physical layout architectures of a memory array. Described in greater detail below, various implementations in accordance with this disclosure may reduce or eliminate those manufacturing challenges and problems.

Figure 2A:
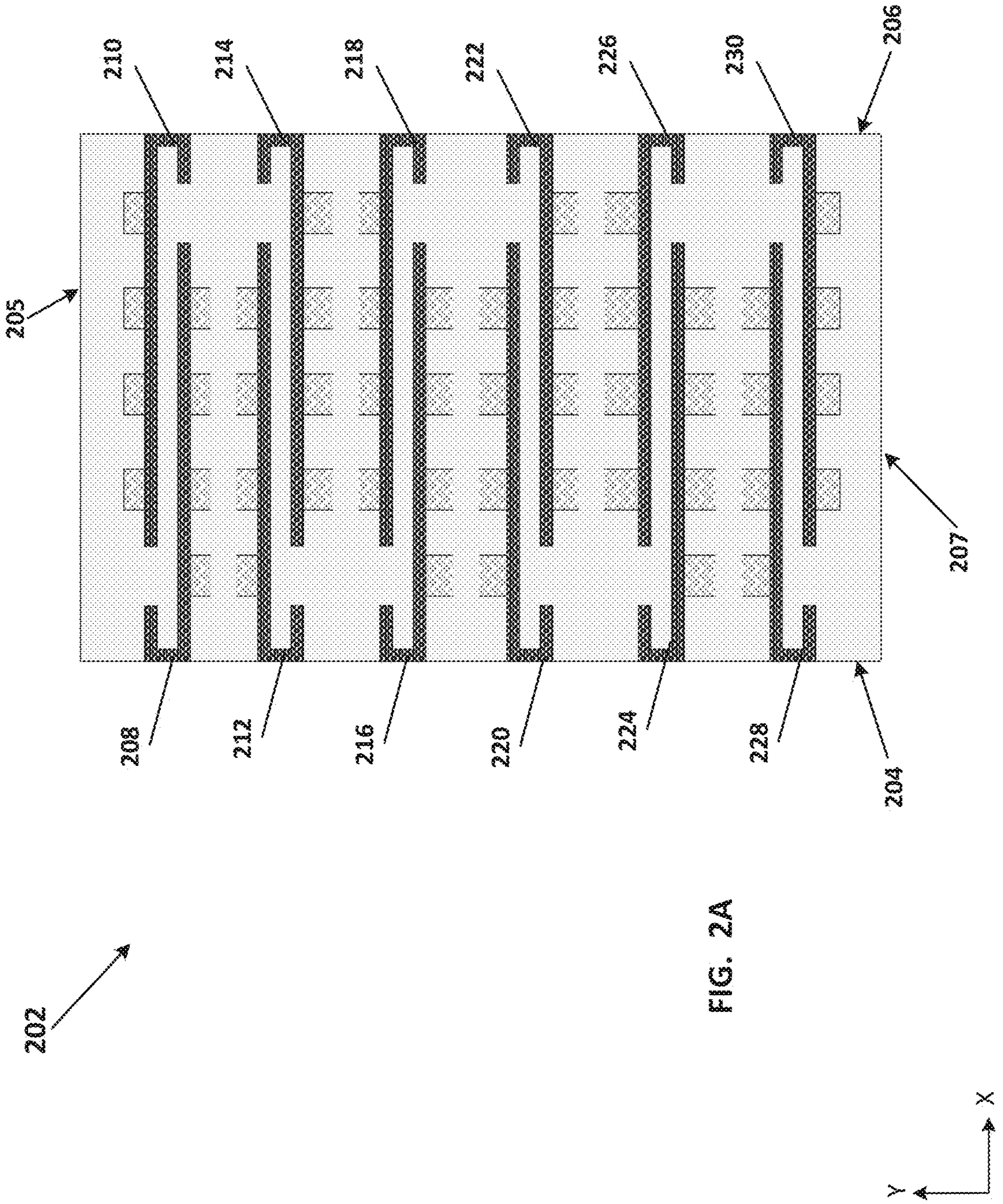
FIG. 2A is a top view illustrating a memory array having a plurality of word lines in accordance with this disclosure.
Figure 2B:
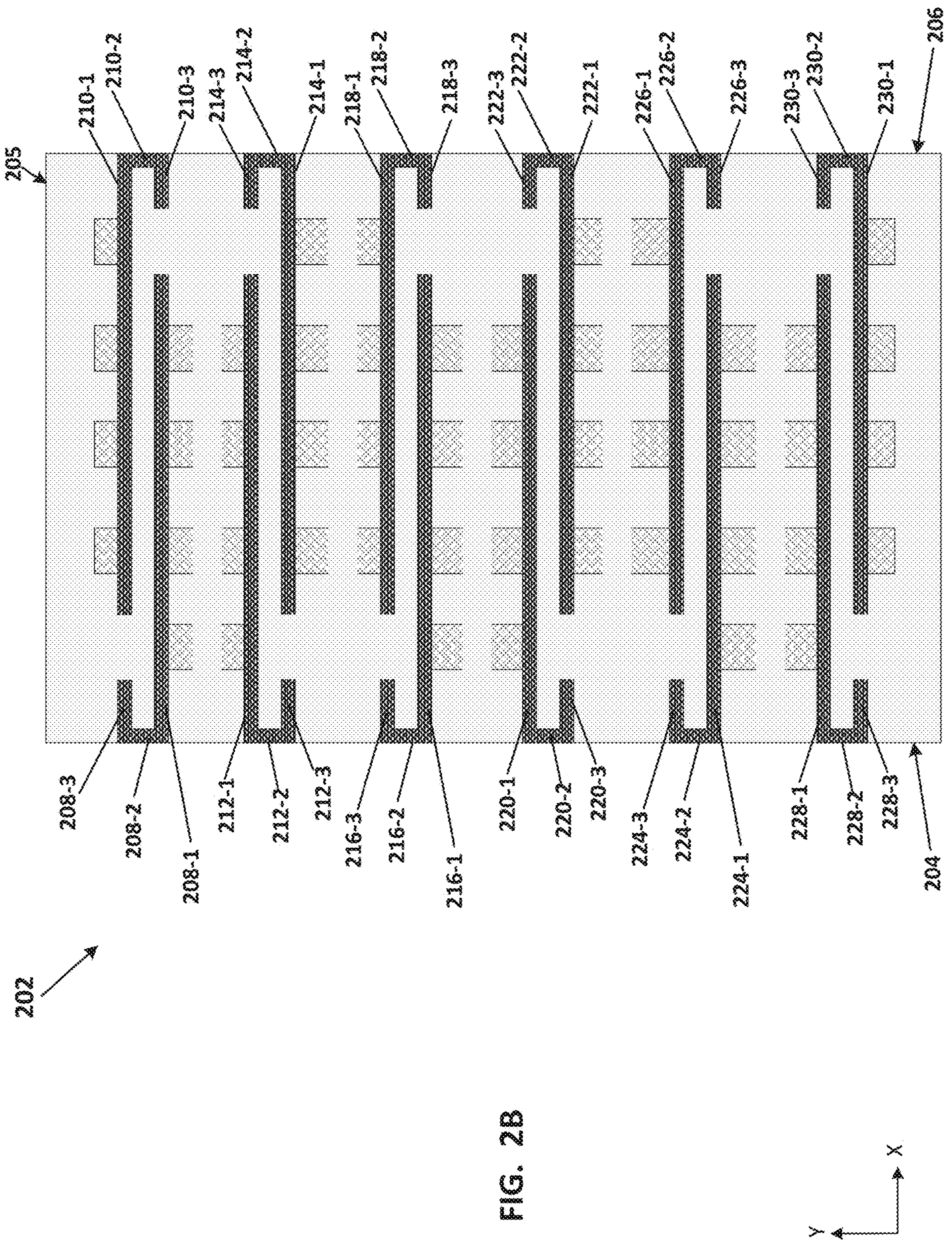
FIG. 2B is a top view illustrating a memory array having a plurality of word lines in accordance with this disclosure.

FIGS. 2A-2B show a top view of a partially fabricated integrated circuit that has a memory array with word lines shaped, i.e., patterned, and arranged in accordance with an illustrative implementation of this disclosure. By forming word lines in accordance with this disclosure, an additional margin is provided for the manufacturing process, and the risk of word line-to-word line shorting is reduced.

FIG. 2A is a top view showing an illustrative memory array 202 in accordance with this disclosure having a first side 204, a second side 206, a third side 205 and a fourth side 207. Memory array 202 has a plurality of first-word-lines 208, 212, 216, 220, 224, and 228 in accordance with this disclosure. Memory array 202 also has a plurality of second-word-lines 210, 214, 218, 222, 226, and 230 in accordance with this disclosure. As indicated above, memory array 202 is illustrative rather than limiting, and implementations in accordance with present disclosure are not limited to any particular number of word lines, bit lines, or memory cells, nor are such implementations limited to a particular manufacturing process.

FIG. 2B is a top view also illustrating memory array 202 wherein the first, second, and third portions of the word lines in accordance with this disclosure are identified. First-word-line 208 of FIG. 2A has three portions and these are identified in FIG. 2B as first portion 208-1, second portion 208-2, and third portion 208-3. Likewise, first-word-line 212 has a first portion 212-1, a second portion 212-2, and a third portion 212-3. First-word-line 216 has a first portion 216-1, a second portion 216-2, and a third portion 216-3. First-word-line 220 has a first portion 220-1, a second portion 220-2, and a third portion 220-3. First-word-line 224 has a first portion 224-1, a second portion 224-2, and a third portion 224-3. First-word-line 228 has a first portion 228-1, a second portion 228-2, and a third portion 228-3. Second-word-line 210 of FIG. 2A has three portions and these are identified in FIG. 2B as first portion 210-1, second portion 210-2, and third portion 210-3. Likewise, second-word line 214 has a first portion 214-1, a second portion 214-2, and a third portion 214-3. Second word-line 218 has a first portion 218-1, a second portion 218-2, and a third portion 218-3. Second-word-line 222 has a first portion 222-1, a second portion 222-2, and a third portion 222-3. Second-word-line 226 has a first portion 226-1, a second portion 226-2, and a third portion 226-3. Second-word-line 230 has a first portion 230-1, a second portion 230-2, and a third portion 230-3.

Referring to FIGS. 2A and 2B, it can be seen that second portion 208-2 of first-word-line 208 is disposed adjacent to first side 204 of memory array 202. Likewise, second portion 212-2 of first-word-line 212 is disposed adjacent to first side 204 of memory array 202. Second portion 216-2 of first-word-line 216 is disposed adjacent to first side 204 of memory array 202. Second portion 220-2 of first-word-line 220 is disposed adjacent to first side 204 of memory array 202. Second portion 224-2 of first-word-line 224 is disposed adjacent to first side 204 of memory array 202. Second portion 228-2 of first-word-line 228 is disposed adjacent to first side 204 of memory array 202. Thus, the second portion of each first-word-line is adjacent to first side 204.

Still referring to FIGS. 2A and 2B, it can be seen that second portion 210-2 of second-word-line 210 is disposed adjacent to second side 206 of memory array 202. Likewise, second portion 214-2 of second-word-line 214 is disposed adjacent to second side 206 of memory array 202. Second portion 218-2 of second-word-line 218 is disposed adjacent to second side 206 of memory array 202. Second portion 222-2 of second-word-line 222 is disposed adjacent to second side 206 of memory array 202. Second portion 226-2 of second-word-line 226 is disposed adjacent to second side 206 of memory array 202. Second portion 230-2 of second-word-line 230 is disposed adjacent to second side 206 of memory array 202. Thus, the second portion of each second-word-line is adjacent to second side 206.

Still referring to FIGS. 2A and 2B, and the foregoing description, it can be seen that the second portion of each first-word-line and the second portion of each second-word-line are disposed, respectively, adjacent to opposite sides of memory array 202. In some implementations, the second portion of each first-word-line is disposed nominally within a first predetermined distance of the first side and a second predetermined distance of the second side, the first predetermined distance being less than the second predetermined distance. In other words, the second portion of each first-word-line is closer to the first side of memory array 202 than the second side of memory array 202. Likewise, the second portion of each second-word-line is disposed nominally within a third predetermined distance of the second side and a fourth predetermined distance of the first side, the third predetermined distance being less than the fourth predetermined distance. In other words, the second portion of each second-word-line is closer to the second side of memory array 202 than the first side of memory array 202. In some implementations, the first predetermined distance is the same as the third predetermined distance. In some implementations, the second predetermined distance is the same as the fourth predetermined distance.

Still referring to FIGS. 2A and 2B, in some implementations, the third portion 208-3 of first-word-line 208 is nominally a first distance from third side 205 of memory array 202, and first portion 210-1 of second-word-line 210 is also nominally the first distance from third side 205. In some implementations, the first portion 208-1 of first-word-line 208 is nominally a second distance from third side 205 of memory array 202, and third portion 210-3 is also nominally the second distance from third side 205. In some implementations, first portion 212-1 of first-word-line 212 is nominally a third distance from third side 205 of memory array 202, and third portion 214-3 of second-word-line 214 is also nominally the third distance from third side 205. In this illustrative implementation, the second distance is greater than the first distance, and the third distance is greater than the second distance.

In some implementations, the first portion of each first-word-line and the first portion of each second-word-line may extend vertically (i.e., the z-direction, see FIGS. 4A-4G) to form one or more vertically-oriented gate electrodes.

Still referring to FIGS. 2A and 2B, it can be seen that the first portion of each first-word-line is spaced apart from its third portion, and it can further be seen that the second portion of each first-word-line is non-parallel and non-co-linear with both its first portion and its third portion, and the second portion of each second-word-line is non-parallel and non-co-linear with both its first portion and its third portion. In some implementations, the first and third portions of each first-word-line are parallel to each other. In some implementations, the first and third portions of each second-word-line are parallel to each other. In some implementations, the second portion of the first-word-lines is perpendicular to its corresponding first and third portions. In some implementations, the second portion of the second-word-lines is perpendicular to its corresponding first and third portions.

Still referring to FIGS. 2A and 2B, it can be seen that the first portion of each first-word-line has a first length, the second portion of each first-word-line has a second length, and the third portion of each first-word-line has a third length, and likewise the first portion of each second-word-line has a fourth length, the second portion of each second-word-line has a fifth length, and the third portion of each second-word-line has a sixth length. In some implementations, the first length is greater than the third length. In some implementations, the first length and the fourth length are nominally the same, the second length and the fifth length are nominally the same, and the third length and the sixth length are nominally the same.

In various implementations in accordance with this disclosure, the shape and arrangement of the first-word-lines provide a location within a predetermined distance of the first side 204 of memory array 202 where a connection between each first-word-line and a circuit, such as but not limited to, a word line driver circuit may be implemented with a contact structure that may make physical contact with at least a portion of the second portion of a first-word-line. In some implementations, the contact structure may additionally make physical contact with at least a portion of the first portion of the first-word-line. In some implementations, the contact structure may additionally make physical contact with at least a portion of the third portion of the first-word-line. In some implementations, the contact structure may make physical contact with at least a portion of a first portion of a first-word-line, at least a portion of a second portion of the first-word-line, and at least a portion of a third portion of the first-word line. In some implementations (for example see FIG. 5D), the contact structure may be placed such that it makes physical contact with a portion of a first portion of a first-word-line, and a portion of a third portion of the first-word-line, without making physical contact with the second portion of the first-word-line. Similarly, the shape and arrangement of the second-word-lines provide a location within a predetermined distance of the second side 206 of memory array 202 where a connection between each second-word-line and a circuit, such as but not limited to, a word line driver circuit may be implemented with a contact structure that may make physical contact with at least a portion of the second portion of a second-word-line. In some implementations, the contact structure may additionally make physical contact with at least a portion of the first portion of the second-word-line. In some implementations, the contact structure may additionally make physical contact with at least a portion of the third portion of the second-word-line. In some implementations, the contact structure may make physical contact with at least a portion of a first portion of a second-word-line, at least a portion of a second portion of the second-word-line, and at least a portion of a third portion of the second-word line. In some implementations (for example see FIG. 5D), the contact structure may be placed such that it makes physical contact with a portion of a first portion of second-word-line, and a portion of a third portion of the second-word-line, without making physical contact with the second portion of the second-word-line.

Figure 3A:
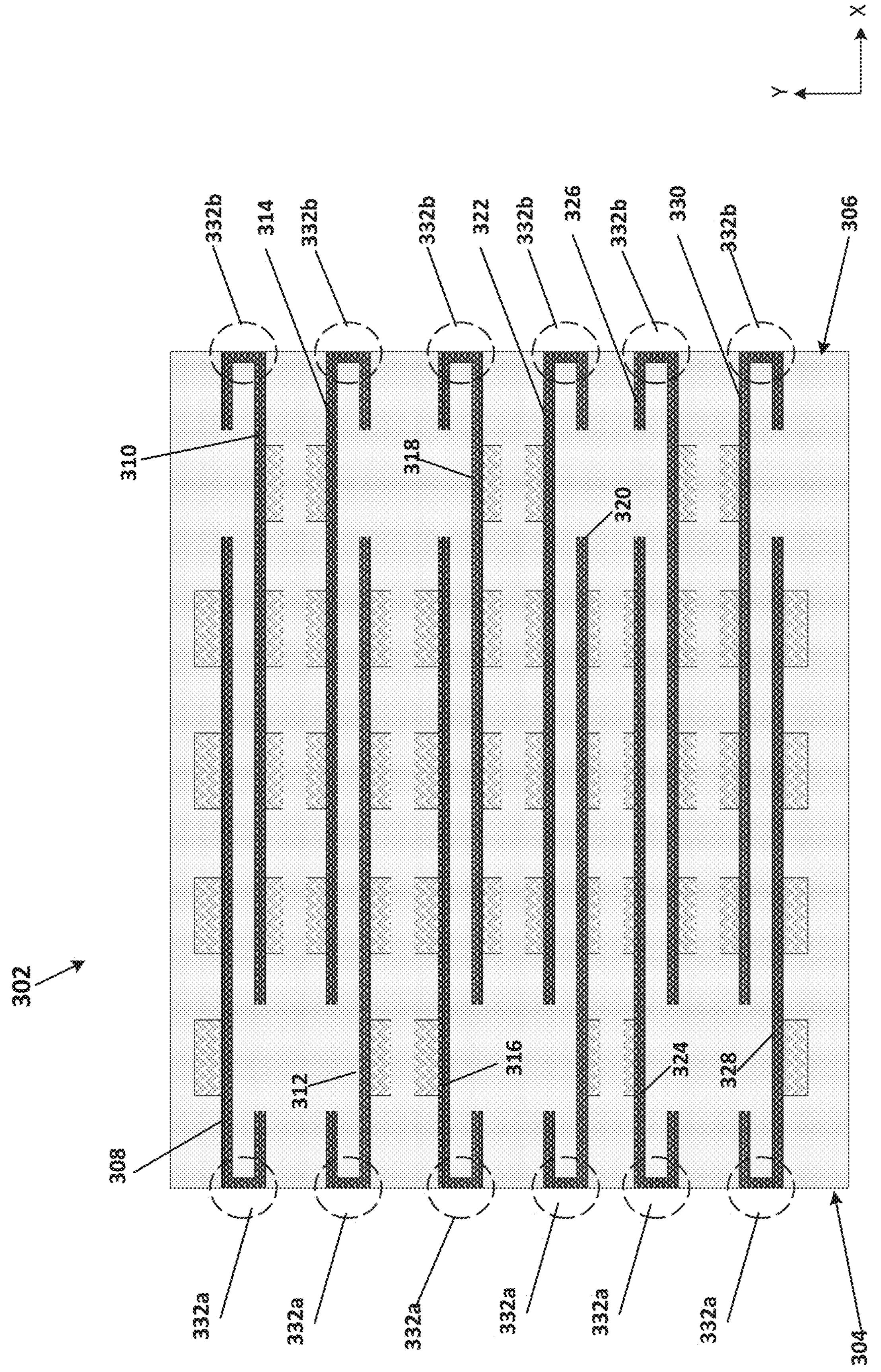
FIG. 3A is a top view illustrating a memory array having a plurality of word lines and word-line-pickup-structures in accordance with this disclosure.
Figure 3B:
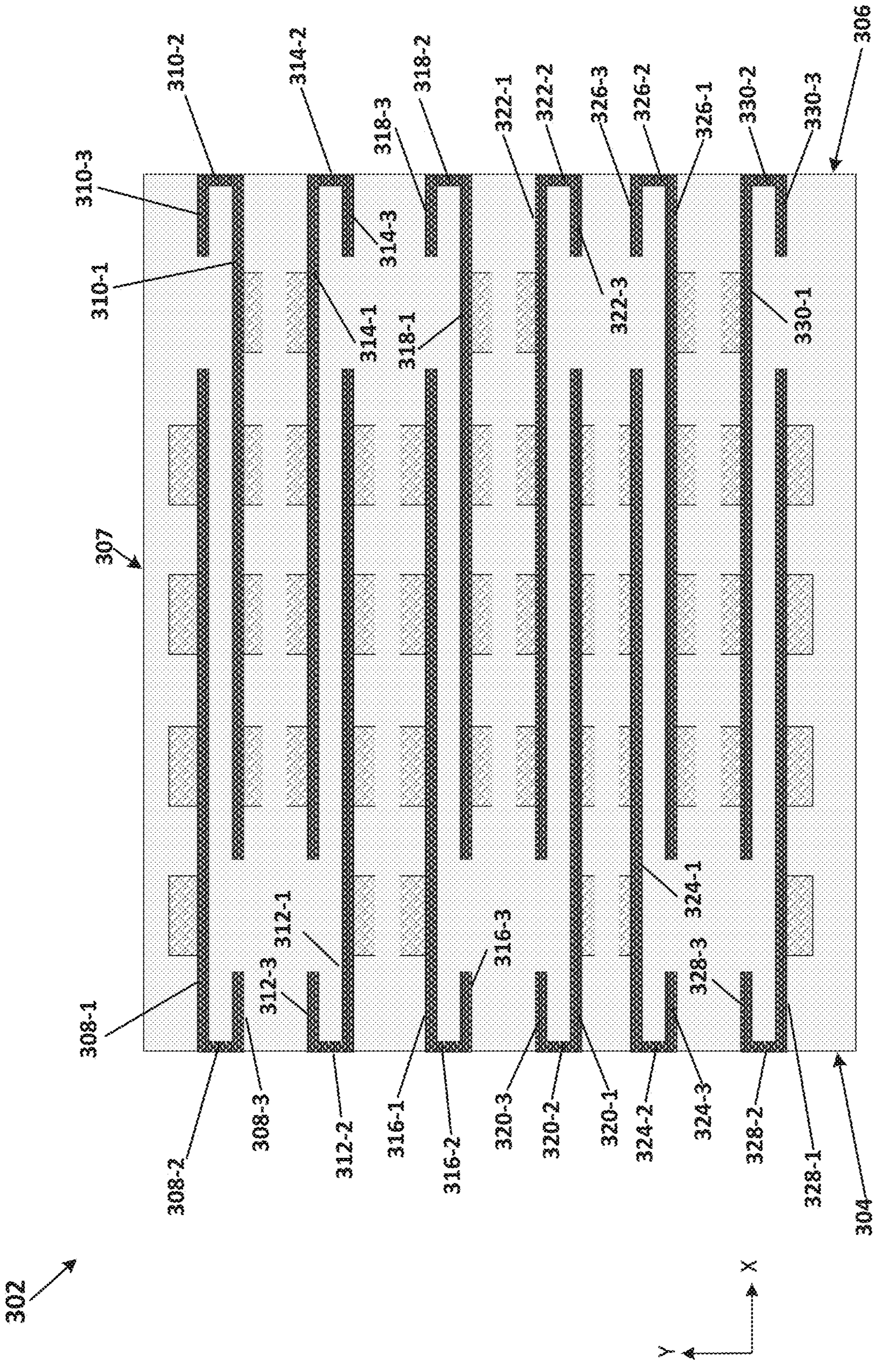
FIG. 3B is a top view illustrating a memory array having a plurality of won and word-line-pickup-structures in accordance with this disclosure.

FIGS. 3A and 3B show a top view of a partially fabricated integrated circuit that has a memory array with word lines shaped, i.e., patterned, and arranged in accordance with an illustrative implementation of this disclosure. FIGS. 3A-3B are similar to FIGS. 2A-2B but illustrate a slightly different arrangement of the word lines. By forming word lines in accordance with this disclosure, an additional margin is provided for the manufacturing process, and the risk of word line-to-word line shorting is reduced.

FIG. 3A is a top view showing an illustrative memory array 302, in accordance with this disclosure, having a first side 304, a second side 306 laterally opposite first side 304, and a third side 307. Memory array 302 has a plurality of first-word-lines 308, 312, 316, 320, 324, and 328, in accordance with this disclosure. Memory array 302 also has a plurality of second-word-lines 310, 314, 318, 322, 326, and 330, in accordance with this disclosure. FIG. 3A also shows a plurality of first-side-word-line-pickup-structures 332*a*, disposed adjacent first side 304 of memory array 302; and a plurality of second-side-word-line-pickup-structures 332*b* disposed adjacent second side 306 of memory array 302.

FIG. 3B is a top view also illustrating memory array 302 wherein the first, second, and third portions of the word-lines in accordance with this disclosure are identified. First-word-line 308 of FIG. 3A has three portions and these are identified in FIG. 3B as first portion 308-1, second portion 308-2, and third portion 308-3. Likewise, first-word-line 312 has a first portion 312-1, a second portion 312-2, and a third portion 312-3. First-word-line 316 has a first portion 316-1, a second portion 316-2, and a third portion 316-3. First-word-line 320 has a first portion 320-1, a second portion 320-2, and a third portion 320-3. First-word-line 324 has a first portion 324-1, a second portion 324-2, and a third portion 324-3. First-word-line 328 has a first portion 328-1, a second portion 328-2, and a third portion 328-3. Second-word-line 310 of FIG. 3A has three portions and these are identified in FIG. 3B as first portion 310-1, second portion 310-2, and third portion 310-3. Likewise, second-word line 314 has a first portion 314-1, a second portion 314-2, and a third portion 314-3. Second word-line 318 has a first portion 318-1, a second portion 318-2, and a third portion 318-3. Second-word-line 322 has a first portion 322-1, a second portion 322-2, and a third portion 322-3. Second-word-line 326 has a first portion 326-1, a second portion 326-2, and a third portion 326-3. Second-word-line 330 has a first portion 330-1, a second portion 330-2, and a third portion 330-3.

Referring to FIGS. 3A and 3B, it can be seen that second portion 308-2 of first-word-line 308 is disposed adjacent to first side 304 of memory array 302. Likewise, second portion 312-2 of first-word-line 312 is disposed adjacent to first side 304 of memory array 302. Second portion 316-2 of first-word-line 316 is disposed adjacent to first side 304 of memory array 302. Second portion 320-2 of first-word-line 320 is disposed adjacent to first side 304 of memory array 302. Second portion 324-2 of first-word-line 324 is disposed adjacent to first side 304 of memory array 302. Second portion 328-2 of first-word-line 328 is disposed adjacent to first side 304 of memory array 302. Thus, the second portion of each first-word-line of memory array 302 is adjacent to first side 304.

Still referring to FIGS. 3A and 3B, it can be seen that second portion 310-2 of second-word-line 310 is disposed adjacent to second side 306 of memory array 302. Likewise, second portion 314-2 of second-word-line 314 is disposed adjacent to second side 306 of memory array 302. Second portion 318-2 of second-word-line 318 is disposed adjacent to second side 306 of memory array 302. Second portion 322-2 of second-word-line 322 is disposed adjacent to second side 306 of memory array 302. Second portion 326-2 of second-word-line 326 is disposed adjacent to second side 306 of memory array 302. Second portion 330-2 of second-word-line 330 is disposed adjacent to second side 306 of memory array 302. Thus, the second portion of each second-word-line of memory array 302 is adjacent to second side 306.

Still referring to FIGS. 3A and 3B, and the foregoing description, it can be seen that the second portion of each first-word-line and the second portion of each second-word-line are disposed, respectively, adjacent to opposite sides 304, 306 of memory array 302. In some implementations, the second portion of each first-word-line is disposed nominally within a first predetermined distance of the first side 304 and a second predetermined distance of the second side 306, the first predetermined distance being less than the second predetermined distance. In other words, the second portion of each first-word-line is closer to the first side 304 of memory array 202 than the second side 306 of memory array 202. Likewise, the second portion of each second-word-line is disposed nominally within a third predetermined distance of the second side 306 and a fourth predetermined distance of the first side 304, the third predetermined distance being less than the fourth predetermined distance. In other words, the second portion of each second-word-line is closer to the second side 306 of memory array 302 than the first side 304 of memory array 302. In some implementations, the first predetermined distance is the same as the third predetermined distance. In some implementations, the second predetermined distance is the same as the fourth predetermined distance.

Still referring to FIGS. 3A and 3B, in some implementations, the first portion 308-1 of first-word-line 308 is nominally a first distance from third side 307 of memory array 302, and third portion 310-3 is nominally a first distance from third side 307 of memory array 302. In some implementations, the third portion 308-3 of first-word-line 308 is nominally a second distance from third side 307 of memory array 302, and first portion 310-1 of second-word-line 310 is also nominally the second distance from third side 307. In some implementations, third portion 312-3 of first-word-line 312 is nominally a third distance from third side 307 of memory array 302, and first portion 314-1 of second-word-line 314 is also nominally the third distance from third side 307. In this illustrative implementation, the second distance is greater than the first distance and the third distance is greater than the second distance.

Still referring to FIGS. 3A and 3B, in some implementations, the first portion of each first-word-line and the first portion of each second-word-line may extend vertically (i.e., the z-direction, see FIGS. 4A-4G) to form one or more vertically-oriented gate electrodes.

Still referring to FIGS. 3A and 3B, it can be seen that the first portion of each first-word-line is spaced apart from its third portion, and it can further be seen that the second portion of each first-word-line is non-parallel and non-co-linear with both its first portion and its third portion, and the second portion of each second-word-line is non-parallel and non-co-linear with both its first portion and its third portion. In some implementations, the first and third portions of each first-word-line are parallel to each other. In some implementations, the first and third portions of each second-word-line are parallel to each other. In some implementations, the second portion of each first-word-line is perpendicular to its corresponding first and third portions. In some implementations, the second portion of each second-word-line is perpendicular to its corresponding first and third portions.

Still referring to FIGS. 3A and 3B, it can be seen that the first portion of each first-word-line has a first length, the second portion of each first-word-line has a second length, and the third portion of each first-word-line has a third length, and likewise the first portion of each second-word-line has a fourth length, the second portion of each second-word-line has a fifth length, and the third portion of each second-word-line has a sixth length. In some implementations, the first length is greater than the third length. In some implementations, the first length and the fourth length are nominally the same, the second length and the fifth length are nominally the same, and the third length and the sixth length are nominally the same.

Still referring to FIGS. 3A and 3B, first-side-word-line-pickup-structures 332*a*, and second-side-word-line-pickup-structures 332*b*, show the regions of each word-line where a contact structure may be formed so as to make physical contact with a corresponding word-line. FIG. 3A identifies these word-line-pickup-structures with dashed-line circles. In this illustrative implementation, first-side-word-line-pickup-structures 332*a* each include a portion of the first portion of each first-word-line, the second portion of each first-word-line, and a portion of the third portion of each first-word-line. Similarly, second-side-word-line-pickup-structures 332*b* each include a portion of the first portion of each second-word-line, the second portion of each second-word-line, and a portion of the third portion of each second-word-line.

In various implementations in accordance with this disclosure, the shape and arrangement of the first-word-lines provide a location within a predetermined distance of the first side 304 of memory array 302 where a connection between each first-word-line and a circuit, such as but not limited to, a word line driver circuit may be implemented with a contact structure (such as but not limited to contact structures 110*a*, 110*b*) that may make physical contact with at least a portion of the second portion of a first-word-line. In various implementations the first-side-word-line-pickup-structures 332*a* may be outside of first side 304, inside of first side 304, or overlapping first side 304. In some implementations, the contact structure may make physical contact with at least a portion of the first portion of a first-word-line. In some implementations, the contact structure may additionally make physical contact with at least a portion of the third portion of a first-word-line. In some implementations, the contact structure may make physical contact with at least a portion of a first portion of a first-word-line, at least a portion of a second portion of the first-word-line, and at least a portion of a third portion of the first-word line. A contact structure disposed at a first-word-line-pickup-location may be referred to as a word-line-pickup-structure. Similarly, the shape and arrangement of the second-word-lines provide a location within a predetermined distance of the second side 306 of memory array 302 where a connection between each second-word-line and a circuit, such as but not limited to, a word line driver circuit may be implemented with a contact structure (such as but not limited to contact structures 110*a*, 110*b*) that may make physical contact with at least a portion of the second portion of a second-word-line. In some implementations, the contact structure may additionally make physical contact with at least a portion of the first portion of the second-word-line. In some implementations, the contact structure may additionally make physical contact with at least a portion of the third portion of the second-word-line. In some implementations, the contact structure may make physical contact with at least a portion of a first portion of a second-word-line, at least a portion of a second portion of the second-word-line, and at least a portion of a third portion of the second-word line. In various implementations the second-side-word-line-pickup-structures 332*b* may be outside of second side 306, inside of second side 306, or overlapping second side 306. A contact structure disposed at a second-word-line-pickup-location may also be referred to as a word-line-pickup structure.

FIGS. 4A-4G are cross-sectional views of a portion of a partially fabricated integrated circuit showing various intermediate structures formed in the course of an illustrative manufacturing process for implementing word-line-pickup-structures in accordance with this disclosure. As noted above, a contact structure disposed at a first-word-line-pickup-location may be referred to as a word-line-pickup structure. Likewise, a contact structure disposed at a second-word-line-pickup-location may also be referred to as a word-line-pickup structure.

Figure 4B:
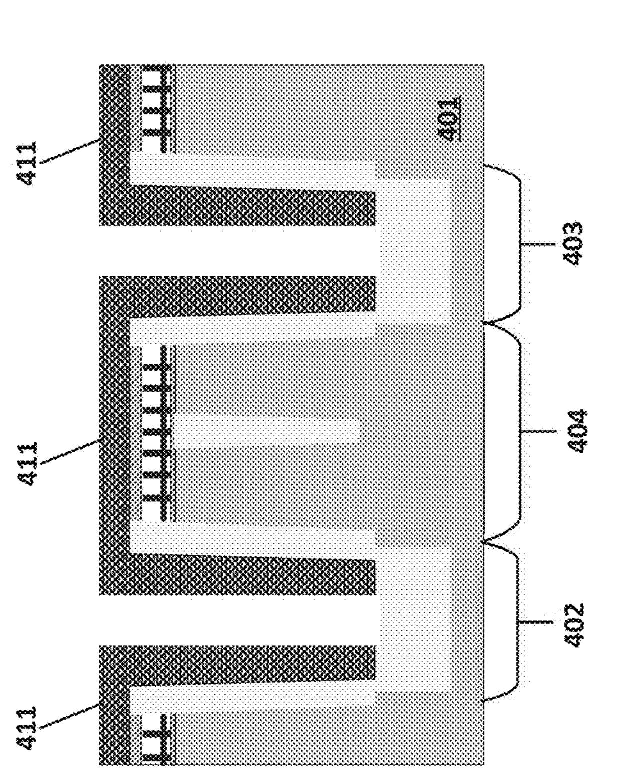
FIG. 4B is a cross-sectional view of an illustrative second intermediate structure formed after a portion of the metal disposed at the bottom of memory array trenches in the first intermediate structure has been removed in accordance with this disclosure.
Figure 4A:
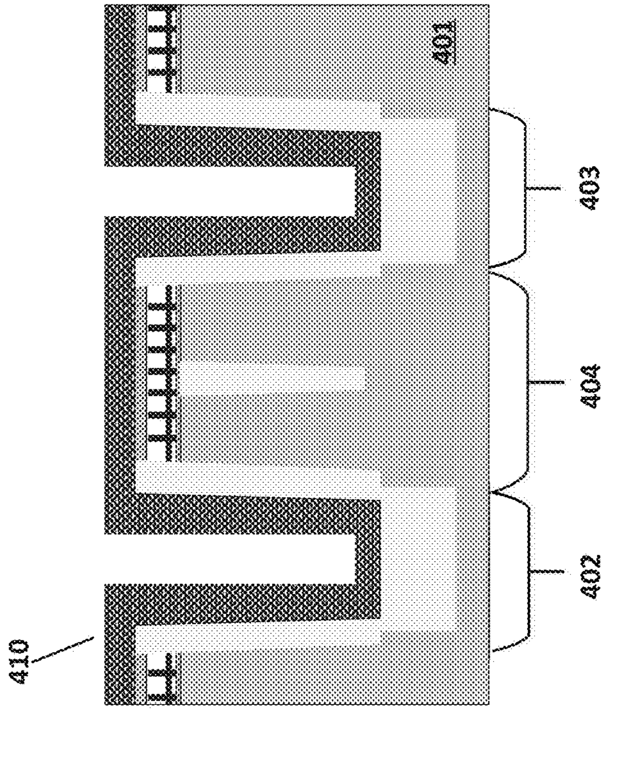
FIG. 4A is a cross-sectional view of an illustrative first intermediate structure formed in manufacturing a memory array having word lines and word-line-pickup-structures in accordance with this disclosure.

FIG. 4A is a cross-sectional view of an illustrative first intermediate structure formed in manufacturing a memory array having word lines and word-line-pickup-structures in accordance with this disclosure. FIG. 4A shows a substrate 401 having a first trench 402, a second trench 403, a first substrate structure 404, and a conductive layer 410 disposed over the sidewalls and bottom of first trench 402, the sidewalls and bottom of second trench 403, and over first substrate structure 404. In this illustrative implementation, conductive layer 410 may be, but is not limited to, a metal, a metal alloy, or a stack of metals.

FIG. 4B is a cross-sectional view of an illustrative second intermediate structure formed after a portion of conductive layer 410 disposed at the bottom of memory array trenches in the first intermediate structure has been removed in accordance with this disclosure. Removing this portion of conductive layer 410 may be performed by patterning a masking material such that a portion of conductive layer 410 disposed at the bottom of first trench 402 and second trench 403 are exposed, and then etching the exposed portions of conductive layer 410. After etching portions of conductive layer 410 at the bottom of trenches 402 and 403 it can be seen in FIG. 4B that conductive layer 410 has been separated into a plurality of conductive sections 411.

Figure 4D:
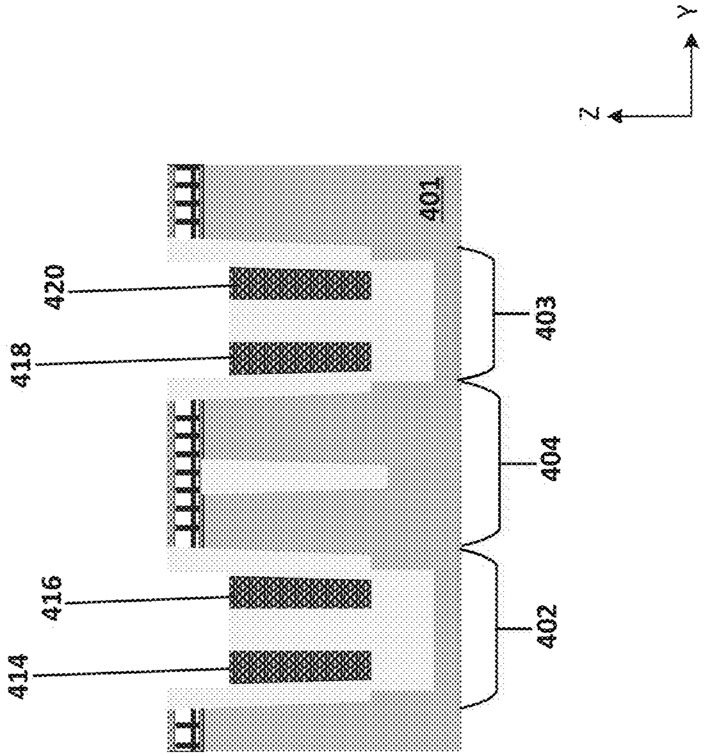
FIG. 4D is a cross-sectional view of an illustrative fourth intermediate structure formed after a dielectric etch and a metal etch are performed on the third intermediate structure in accordance with this disclosure.
Figure 4C:
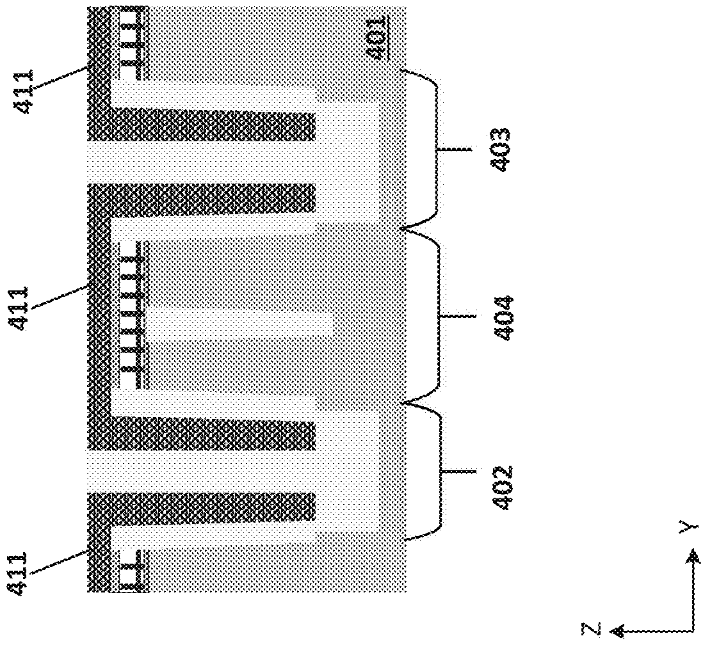
FIG. 4C is a cross-sectional view of an illustrative third intermediate structure formed after a dielectric deposition and planarization in accordance with this disclosure.

FIG. 4C is a cross-sectional view of an illustrative third intermediate structure formed after a dielectric deposition and planarization in accordance with this disclosure. It can be seen in FIG. 4C that a dielectric material has been deposited into first trench 402 and second trench 403 such that the dielectric material fills the gap between vertically-oriented portions of conductive sections 411. The dielectric material that is deposited may be, but is not limited to, silicon dioxide. Planarization may be performed by any suitable manufacturing process such as, but not limited to, chemical-mechanical polishing (CMP).

FIG. 4D is a cross-sectional view of an illustrative fourth intermediate structure formed after a dielectric etch and a conductive layer (e.g., metal) etch are performed on the third intermediate structure (shown in FIG. 4C) in accordance with this disclosure. As shown in FIG. 4D, the indicated dielectric etch removes an upper portion of the dielectric material that filled the gap between vertically-oriented portions of conductive sections 411 in each of first trench 402 and second trench 403. Further, the indicated conductive layer etch removes upper portions of the vertically-oriented portions of conductive sections 411 in each of first trench 402 and second trench 403. Thus, conductive sections 411 are transformed, as shown, into vertically-oriented gate electrodes 414, 416, 418, and 420.

Figure 4F:
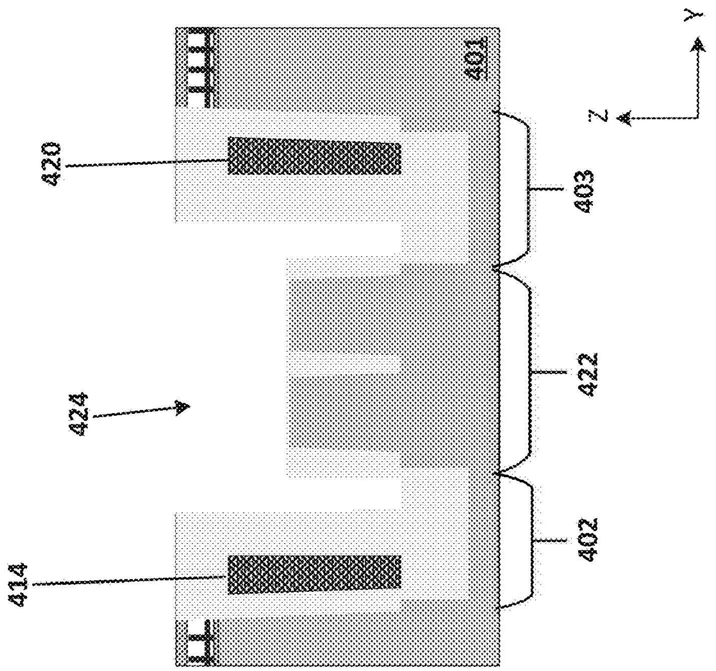
FIG. 4F is a cross-sectional view of an illustrative sixth intermediate structure formed after portions of a dielectric layer overlying vertically-oriented gate electrodes, the exposed gate electrodes, and a portion of the substrate have been removed from the fifth intermediate structure in accordance with this disclosure.
Figure 4E:
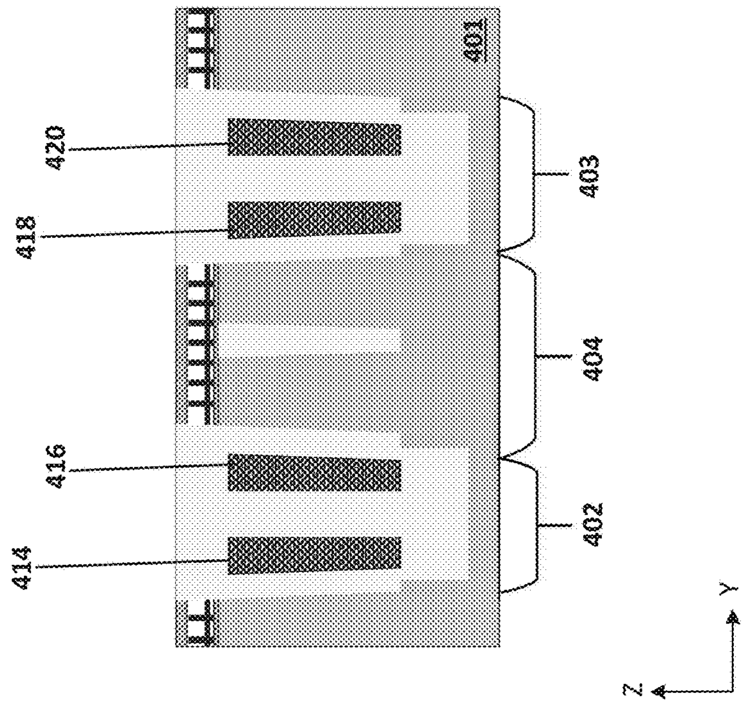
FIG. 4E is a cross-sectional view of an illustrative fifth intermediate structure formed after a dielectric deposition and planarization are performed on the fourth intermediate structure in accordance with this disclosure.

FIG. 4E is a cross-sectional view of an illustrative fifth intermediate structure formed after a dielectric deposition and planarization are performed on the fourth intermediate structure in accordance with this disclosure. The dielectric material that is deposited may be, but is not limited to, silicon dioxide. As indicated in FIG. 4E, the deposited dielectric material fills the gaps in first trench 402 and second trench 403. Planarization may be performed by any suitable manufacturing process such as, but not limited to, CMP.

FIG. 4F is a cross-sectional view of an illustrative sixth intermediate structure formed, in accordance with this disclosure, after (1) the dielectric material overlying vertically-oriented gate electrodes 416, 418, is removed thereby exposing the upper surfaces of vertically-oriented gate electrodes 416, 418; (2) the exposed gate electrodes 416, 418 are removed; and (3) a portion of first substrate structure 404 is removed thereby forming second substrate structure 422. Removal of the dielectric material overlying vertically-oriented gate electrodes 416, 418, the vertically-oriented gate electrodes 416, 418, and the portion of first substrate structure 404 forms a gap 424.

FIG. 4G is a cross-sectional view of an illustrative seventh intermediate structure formed after a dielectric deposition and a planarization operation have been performed on the sixth intermediate structure in accordance with this disclosure. More particularly, it can be seen that gap 424 has been filled with a dielectric material. The dielectric material that is deposited may be, but is not limited to, silicon dioxide. Planarization may be performed by any suitable manufacturing process such as, but not limited to, CMP. FIG. 4G shows that vertically-oriented gate electrodes 414 and 420 remain after vertically-oriented gate electrodes 416, 418, have been removed. It will be appreciated that, in this illustrative implementation, vertically-oriented gate electrodes 414 and 420 are not “floating,” but rather are each coupled to respective word-lines (not shown in cross-sectional view) as explained below in connection with FIGS. 5A-5B.

Figure 5B:
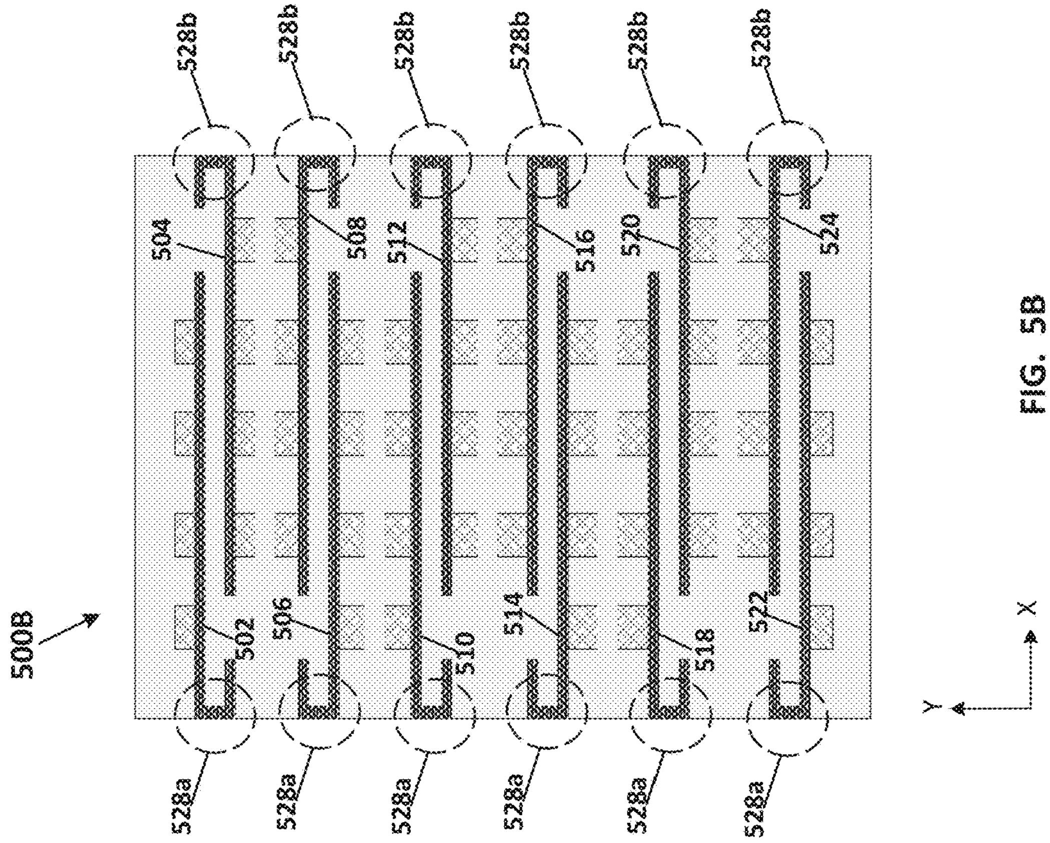
FIG. 5A is a top view of the illustrative sixth intermediate structure in accordance with this disclosure.
FIG. 5C is a top view of the structure of FIG. 5B after a contact structure has been disposed on each word-line in accordance with this disclosure.
FIG. 5D is a top view of the structure of FIG. 5B after an alternative set of contact structures have been disposed in accordance with this disclosure.
Figure 5A:
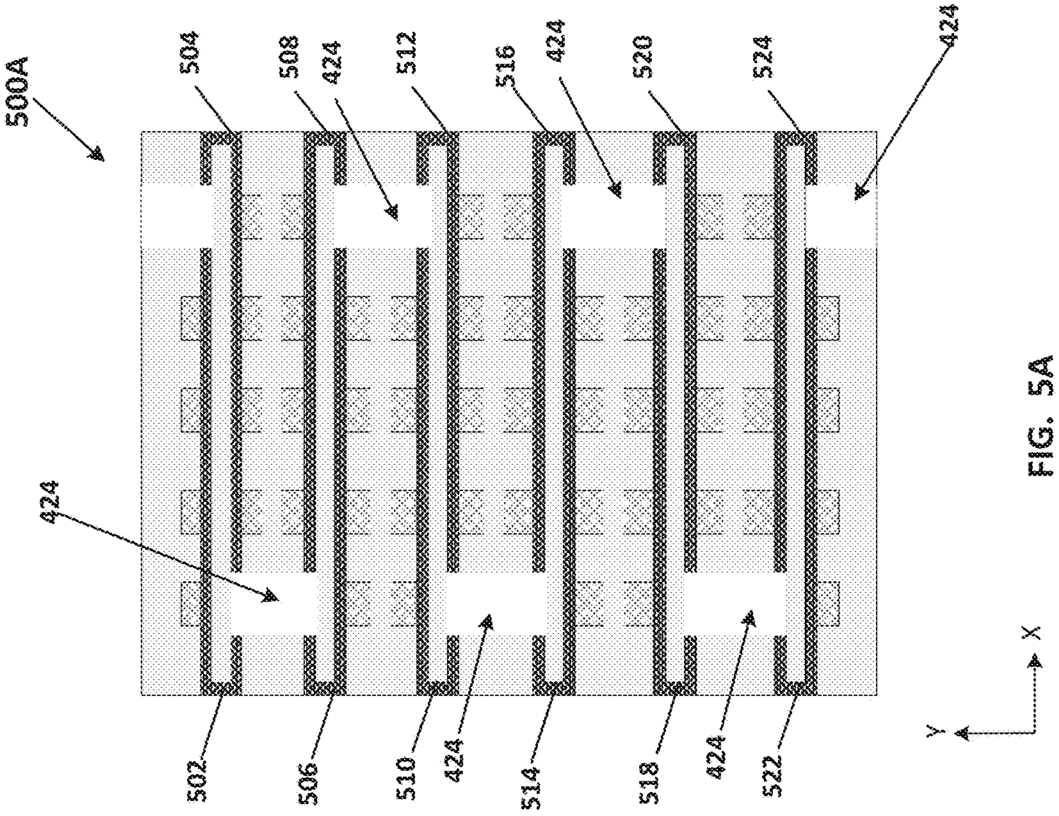

FIG. 5A is a top view of the illustrative intermediate structure of FIG. 4F in accordance with this disclosure. FIG. 5A shows a partially fabricated memory array 500A in accordance with this disclosure. FIG. 5A illustrates the shape and arrangement of first-word-lines 502, 506, 510, 514, 518, 522, and further illustrates the shape and arrangement of second-word-lines 504, 508, 512, 516, 520, 524. Additionally, FIG. 5A provides a top view of the gaps 424. As discussed above in connection with FIG. 4F, each gap 424 is formed by removing a portion of the dielectric material in first trench 402, a portion of the dielectric material in second trench 403, and an upper portion of substrate structure 404.

FIG. 5B is a top view of the illustrative intermediate structure FIG. 4G in accordance with this disclosure. FIG. 5B shows a partially fabricated memory array 500B in accordance with this disclosure. More particularly, FIG. 5B shows the structure of FIG. 5A after gaps 424 have been filled with dielectric material, and further identifies first-word-line-pickup-structures 528*a*, and second-word-line-pickup-structures 528*b*. In this illustrative implementation, each first-word-line-pickup-structure 528*a* includes a portion of the first portion of a first-word-line, the second portion of the first-word-line, and a portion of the third portion of the first-word-line (also see FIGS. 3A and 3B). Similarly, in this illustrative implementation, each second-word-line-pickup-structure 528*b* includes a portion of the first portion of a second-word-line, the second portion of the second-word-line, and a portion of the third portion of the second-word-line (also see FIGS. 3A and 3B).

Figure 5C:
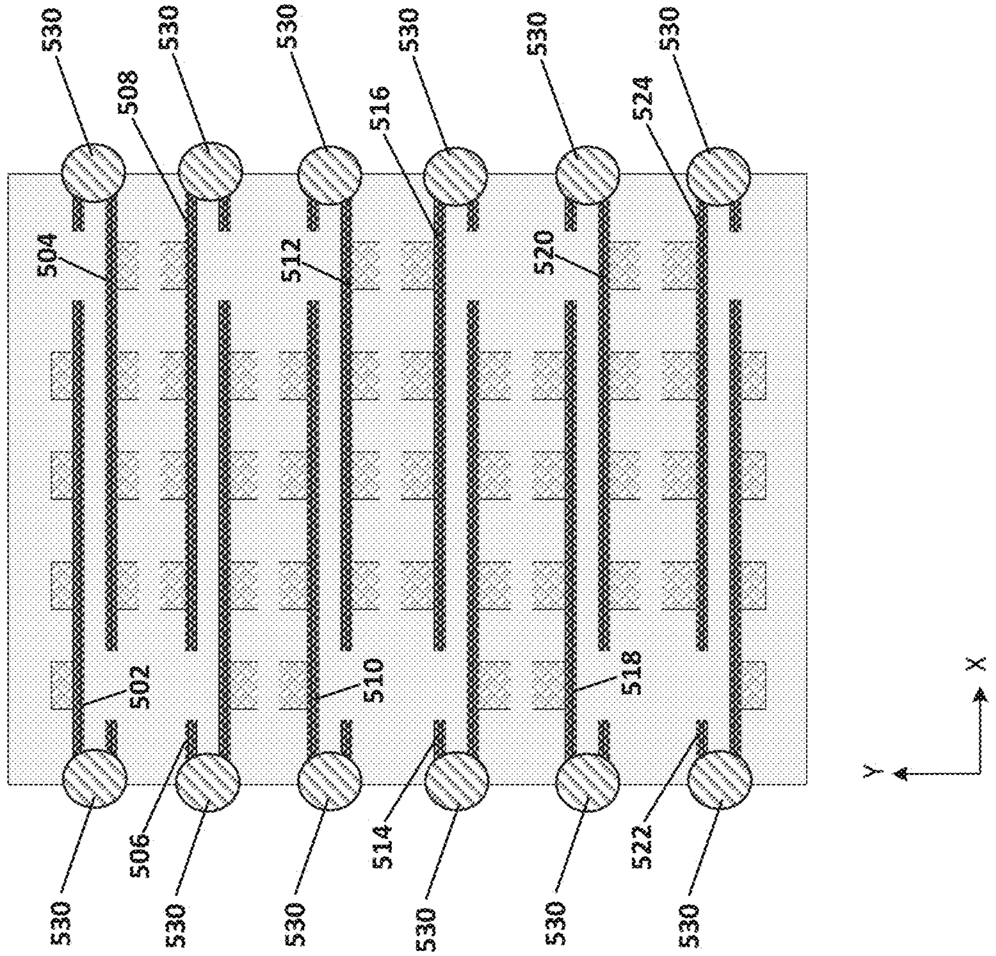

FIG. 5C is a top view of the illustrative intermediate structure of FIG. 5B after contact structures 530 have been formed in accordance with this disclosure. FIG. 5C shows a partially fabricated memory array 500C in accordance with this disclosure. Referring to FIGS. 5B and 5C, it can be seen that in this illustrative implementation a contact structure 530 is disposed on each first-word-line-pickup-structure 528*a* and on each second-word-line-pickup-structure 528*b*.

Figure 5D:
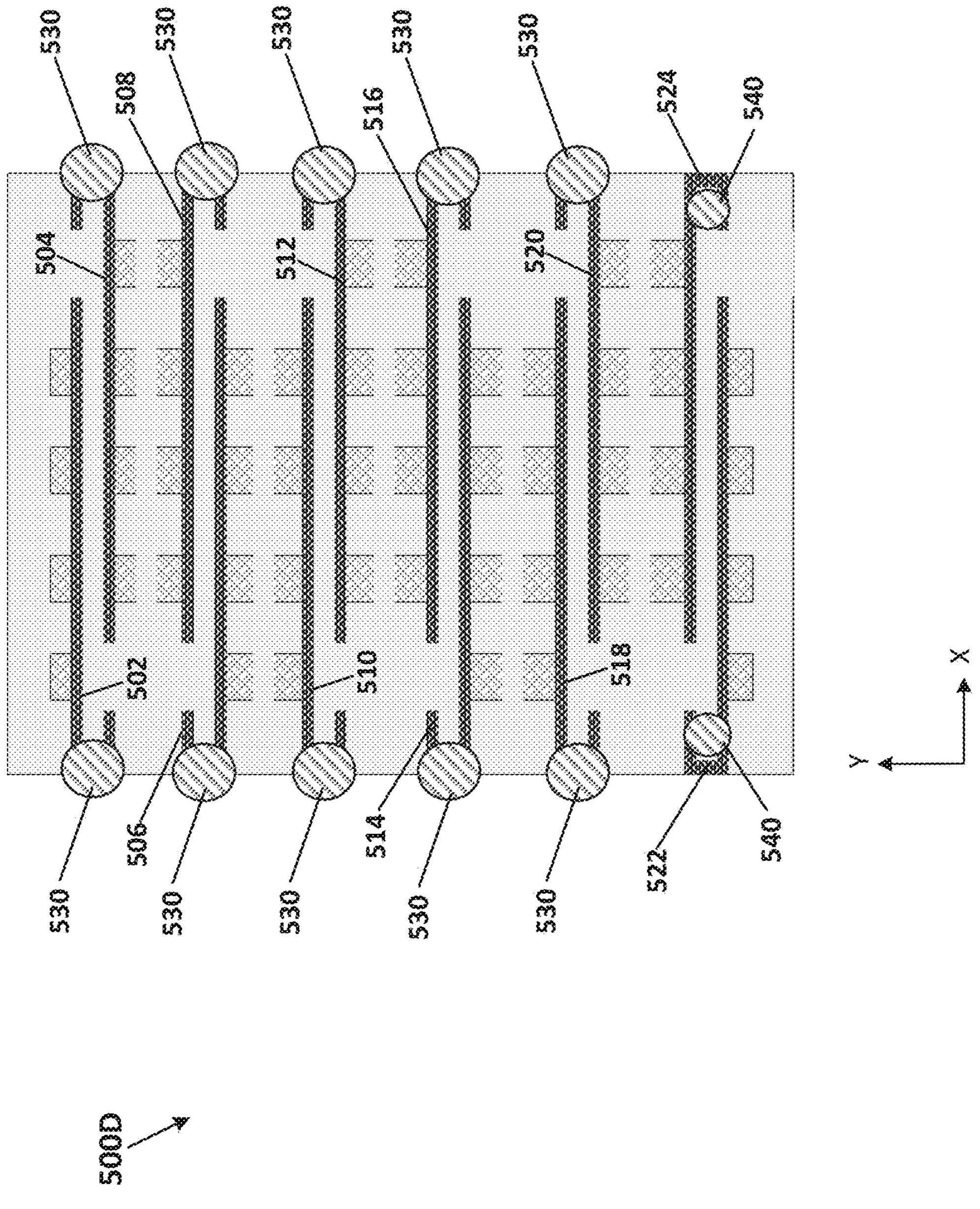

FIG. 5D is a top view of the illustrative intermediate structure of FIG. 5B after contact structures 530 and 540 have been formed in accordance with this disclosure. FIG. 5D shows a partially fabricated memory array 500D in accordance with this disclosure. FIG. 5D is similar to FIG. 5C but includes a contact structure 540 disposed on a portion of a first portion of first-word-line 522, and on a portion of the third portion of first-word-line 522, without making contact with the second portion of first-word-line 522. Similarly, another contact structure 540 is disposed on a portion of a first portion of second-word-line 524, and on a portion of the third portion of second-word-line 524 without making contact with the second portion of second-word-line 524. It is noted that the relative sizes of contact structures 530 and 540 shown in FIG. 5D are for illustrative purposes only, and these contact structures may be larger, smaller, or different shapes within the scope of this disclosure.

Figure 6:
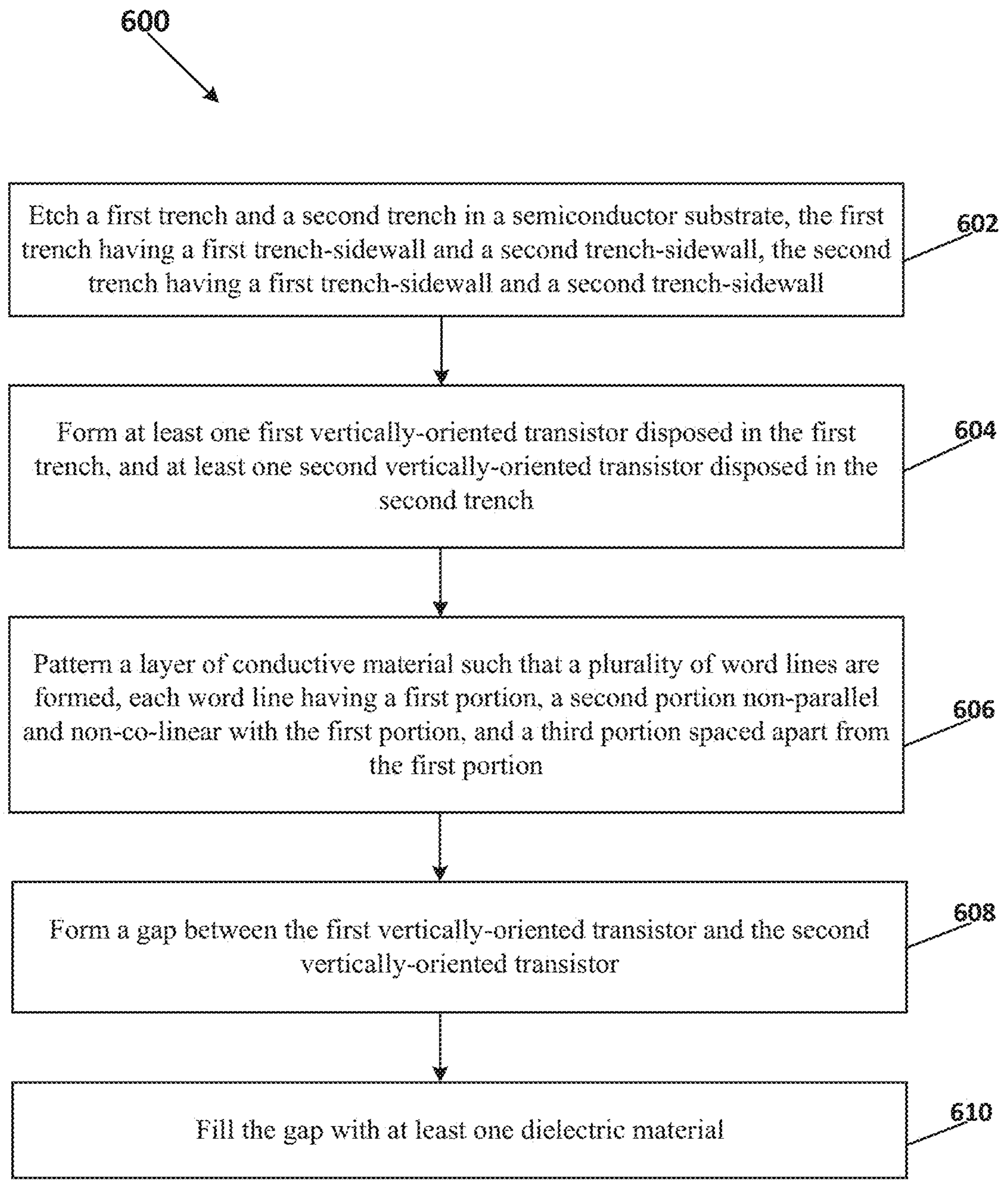
FIG. 6 is a flow diagram of an illustrative method in accordance with this disclosure.

FIG. 6 is a flow diagram of an illustrative method 600 in accordance with this disclosure. Illustrative method 600 includes, at 602, etching a first trench and a second trench in a semiconductor substrate, the first trench having a first trench-sidewall and a second trench-sidewall, the second trench having a first trench-sidewall and a second trench-sidewall. The semiconductor substrate may be a monocrystalline silicon substrate, but is not so limited. Method 600 further includes, at 604, forming at least one first vertically-oriented transistor disposed in the first trench, and at least one second vertically-oriented transistor disposed in the second trench. In illustrative method 600, first vertically-oriented transistor and second vertically-oriented transistor are each field effect transistors. Illustrative method 600 continues at 606 patterning a layer of conductive material such that a plurality of word lines are formed, each word line having a first portion, a second portion non-parallel and non-co-linear with the first portion, and a third portion spaced apart from the first portion. In illustrative method 600, the layer of conductive material may be, but is not limited to, a metal, a metal alloy, a combination of conductive materials. Illustrative method 600 further includes, at 608, forming a gap between the first vertically-oriented transistor and the second vertically-oriented transistor; and at 610 filling the gap with at least one dielectric material. The at least one dielectric material may be, but is not limited to, an oxide of silicon.

Figure 7A:
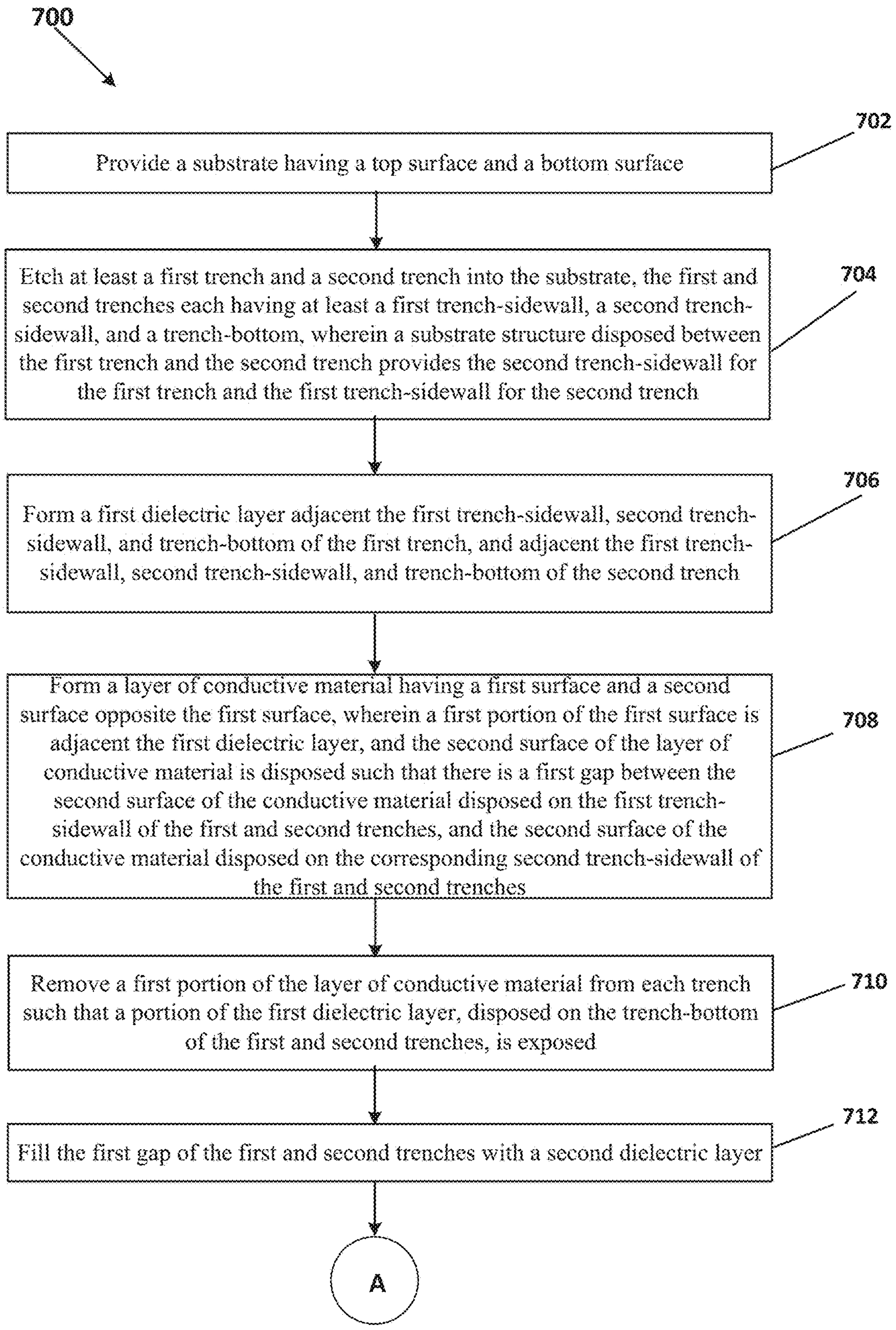
FIGS. 7A-7B show a flow diagram of an alternative illustrative method in accordance with this disclosure.
Figure 7B:
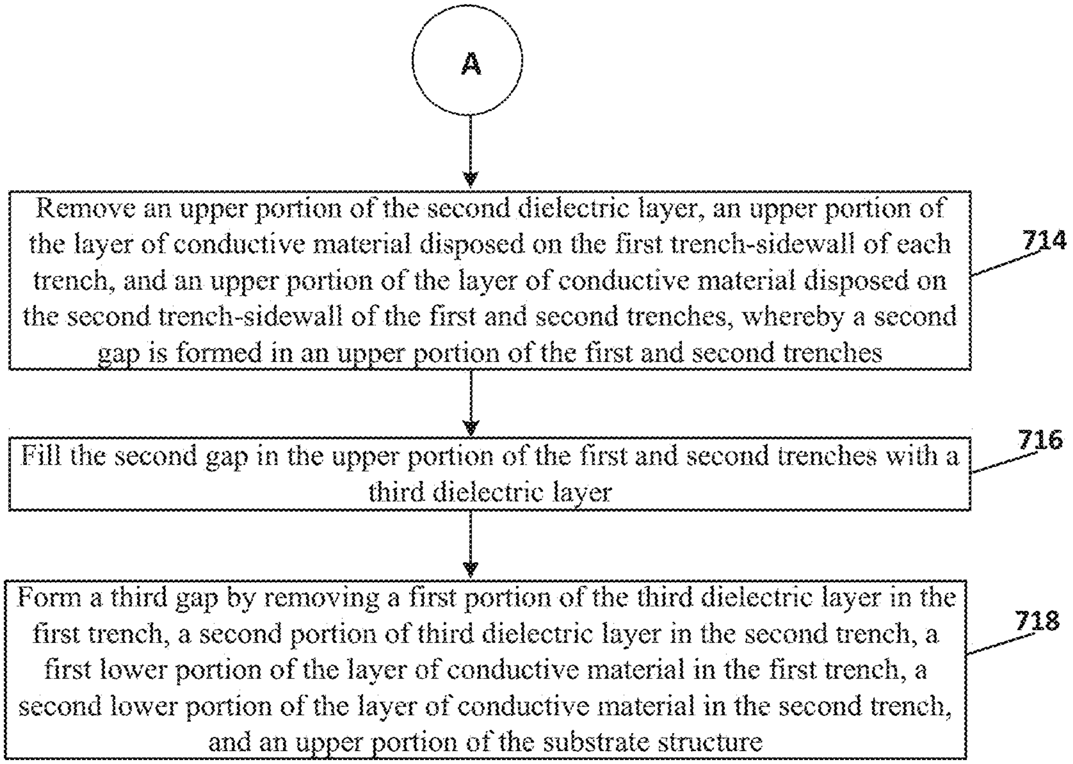

FIGS. 7A-7B show a flow diagram of an alternative illustrative method 700 in accordance with this disclosure. Illustrative method 700 includes, at 702, providing a substrate having a top surface and a bottom surface. In illustrative method 700, the substrate is a semiconductor material such as, but not limited to, silicon or silicon germanium. Illustrative method 700 includes, at 704, etching at least a first trench and a second trench into the substrate, the first and second trenches each having at least a first trench-sidewall, a second trench-sidewall, and a trench-bottom, wherein a substrate structure disposed between the first trench and the second trench provides the second trench-sidewall for the first trench and the first trench-sidewall for the second trench. Illustrative method 700 includes, at 706, forming a first dielectric layer adjacent to the first trench-sidewall, second trench-sidewall, and trench-bottom of the first trench, and adjacent to the first trench-sidewall, second trench-sidewall, and trench-bottom of the second trench. The first dielectric layer may be, but is not limited to, an oxide of silicon. Illustrative method 700 includes, at 708, forming a layer of conductive material having a first surface and a second surface opposite the first surface, wherein a first portion of the first surface is adjacent to the first dielectric layer, and the second surface of the layer of conductive material is disposed such that there is a first gap between the second surface of the conductive material disposed on the first trench-sidewall of the first and second trenches, and the second surface of the conductive material disposed on the corresponding second trench-sidewall of the first and second trenches. Illustrative method 700 includes, at 710, removing a first portion of the layer of conductive material from each trench such that a portion of the first dielectric layer, disposed on the trench-bottom of the first and second trenches, is exposed. Illustrative method 700 includes, at 712, filling the first gap of the first and second trenches with a second dielectric layer. Illustrative method 700 includes, at 714, removing an upper portion of the second dielectric layer, an upper portion of the layer of conductive material disposed on the first trench-sidewall of each trench, and an upper portion of the layer of conductive material disposed on the second trench-sidewall of the first and second trenches, whereby a second gap is formed in an upper portion of the first and second trenches. Illustrative method 700 includes, at 716, filling the second gap in the upper portion of the first and second trenches with a third dielectric layer. Illustrative method 700 further includes, at 718, forming a third gap by removing a first portion of the third dielectric layer in the first trench, a second portion of the third dielectric layer in the second trench, a first lower portion of the layer of conductive material in the first trench, a second lower portion of the layer of conductive material in the second trench, and an upper portion of the substrate structure.

Figure 8:
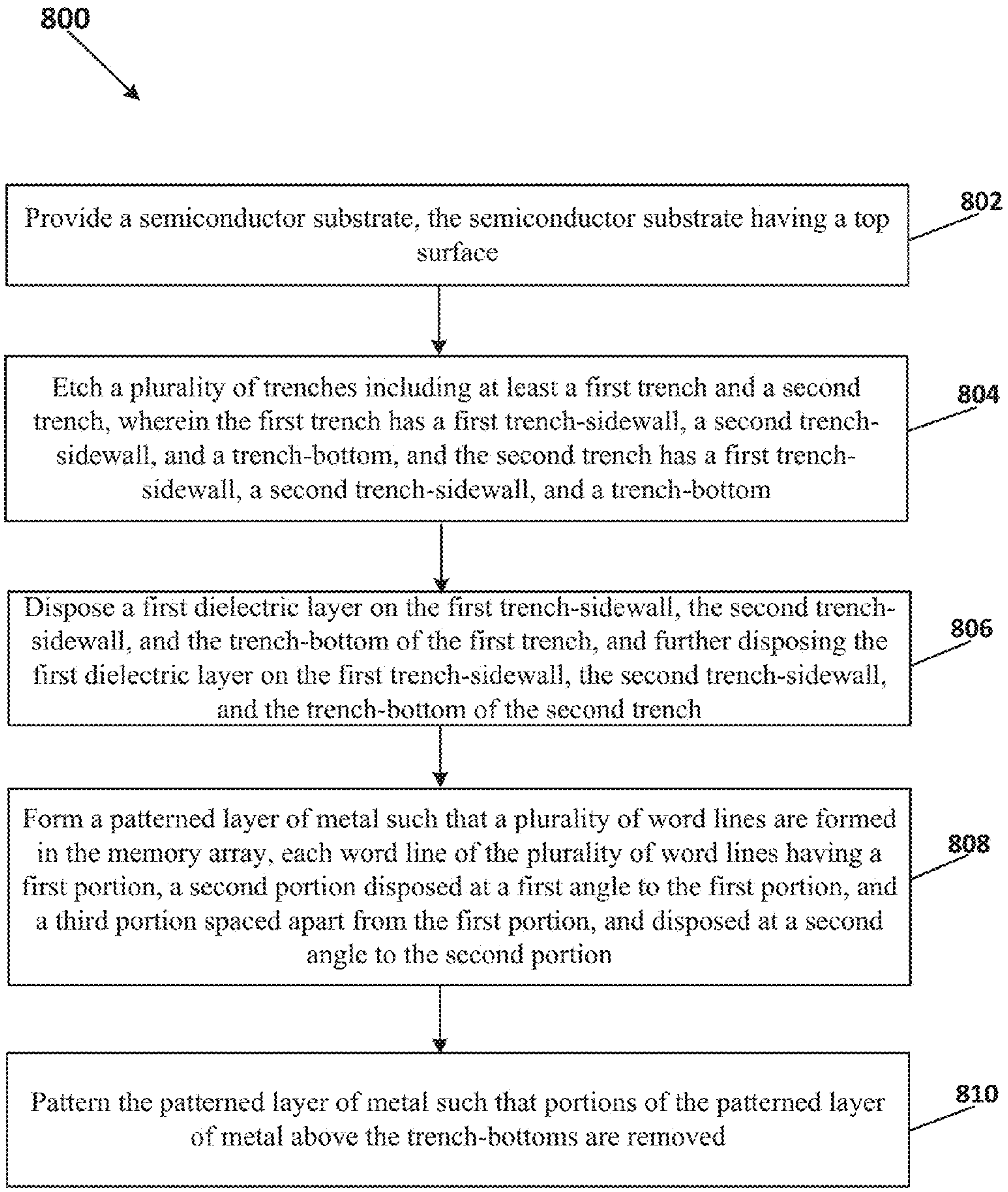
FIG. 8 is a flow diagram of another alternative illustrative method in accordance with this disclosure.

FIG. 8 is a flow diagram of another alternative illustrative method 800 in accordance with this disclosure. Illustrative method 800 includes, at 802, providing a semiconductor substrate, the semiconductor substrate having a top surface. Illustrative method 800 includes, at 804, etching a plurality of trenches including at least a first trench and a second trench, wherein the first trench has a first trench-sidewall, a second trench-sidewall, and a trench-bottom, and the second trench has a first trench-sidewall, a second trench-sidewall, and a trench-bottom. Illustrative method 800 includes, at 806, disposing a first dielectric layer on the first trench-sidewall, the second trench-sidewall, and the trench-bottom of the first trench, and further disposing the first dielectric layer on the first trench-sidewall, the second trench-sidewall, and the trench-bottom of the second trench. Illustrative method 800 includes, at 808, forming a patterned layer of metal such that a plurality of word lines are formed in the memory array, each word line of the plurality of word lines having a first portion, a second portion disposed at a first angle to the first portion, and a third portion spaced apart from the first portion, and disposed at a second angle to the second portion. Illustrative method 800 further includes, at 810, patterning the patterned layer of metal such that portions of the patterned layer of metal above the trench-bottoms are removed. In illustrative method 800, a first set of the plurality of word lines have their corresponding second portions disposed at a first side of a memory array, and a second set of the plurality of word lines have their corresponding second portions disposed at a second side of the memory array.

Figure 9:
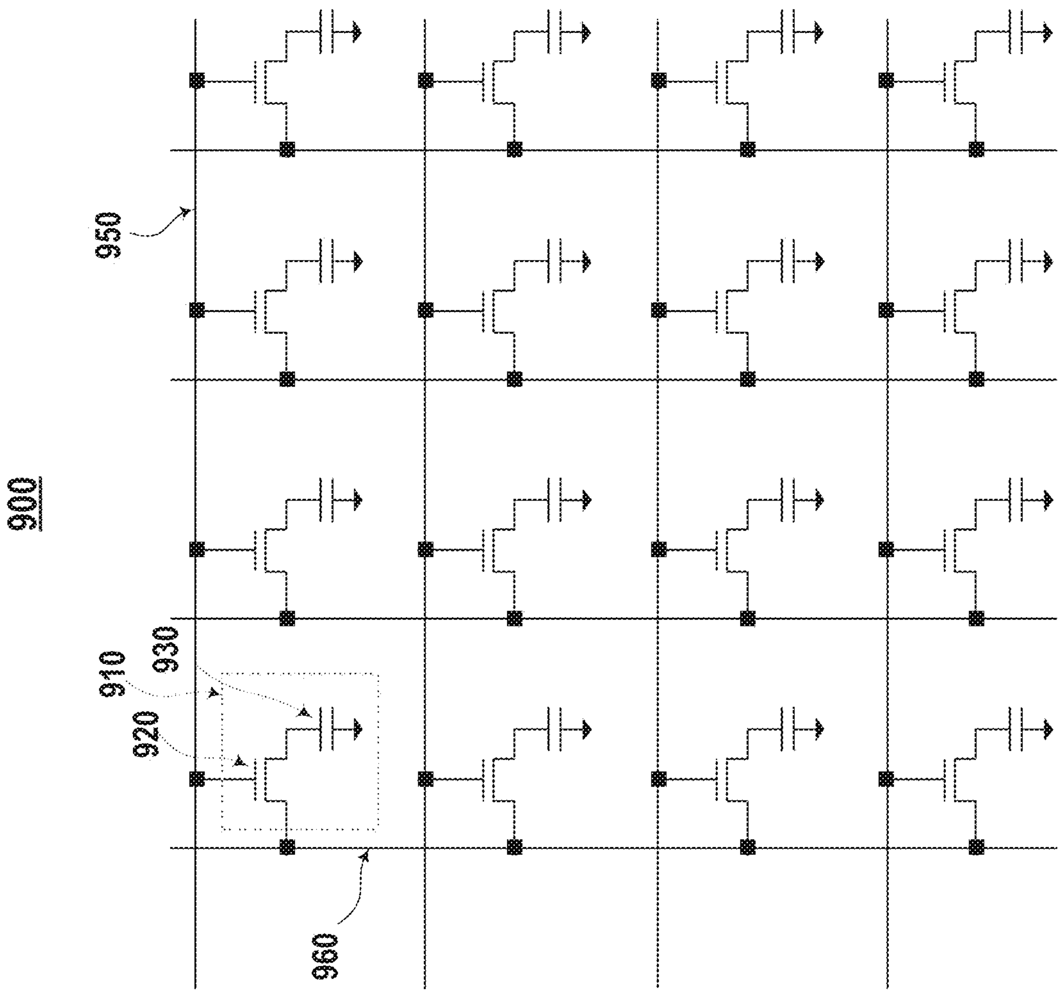
FIG. 9 is a schematic diagram of an illustrative array of dynamic memory cells.

FIG. 9 is a schematic diagram of an illustrative array 900 of dynamic memory cells 910. Each dynamic memory cell 910 in array 900 includes a field effect transistor (FET) 920 and a capacitor 930. The dynamic memory cells 910 are arranged in rows and columns to form a two-dimensional array, i.e., array 900. In the example of FIG. 9, array 900 has four rows and four columns. Thus, the four-by-four arrangement of illustrative array 900 provides sixteen dynamic memory cells 910. Various arrays, in accordance with this disclosure, may be made in any combination of rows and columns, and the illustrative four-by-four array shown in FIG. 9, is not a limitation on the size of an array 900 in accordance with this disclosure.

Still referring to FIG. 9, a gate terminal of FET 920 is coupled to a word line 950, a first source/drain (S/D)

terminal of FET 920 is coupled to a bit line 960, a second S/D terminal of FET 920 is coupled to a first terminal of capacitor 930, and a second terminal of capacitor 930 is coupled to a ground node. This arrangement is sometimes referred to as a "1T1C" memory cell, also known as a one-transistor, one-capacitor memory cell. In a 1T1C memory cell, there is one transistor and one capacitor per memory cell. The transistor acts as the access device, controlling the flow of charge to and from the capacitor. The capacitor is used to store and hold the charge, representing the data stored in the memory cell. The basic operation of a 1T1C memory cell involves two main states, i.e., the charged state and the discharged state. The charged state may represent a "1" bit, and the discharged state may represent a "0" bit. During a write operation, FET 920 is used to couple the capacitor 930 to a voltage source or ground via the bit line 960, allowing charge to be transferred onto or discharged from the capacitor 930. This write operation modifies the charge stored in the capacitor, thereby storing the desired data. During a read operation, FET 920 is used to couple the capacitor 930 to a sense amplifier (not shown) via the bit line 960, which detects and amplifies the charge stored in the capacitor. The amplified signal is then interpreted as the stored data.

It will be appreciated by those skilled in the art that alternative dynamic memory cell circuit arrangements are possible, and implementations in accordance with this disclosure are not limited to 1T1C memory cells.

Figure 10:
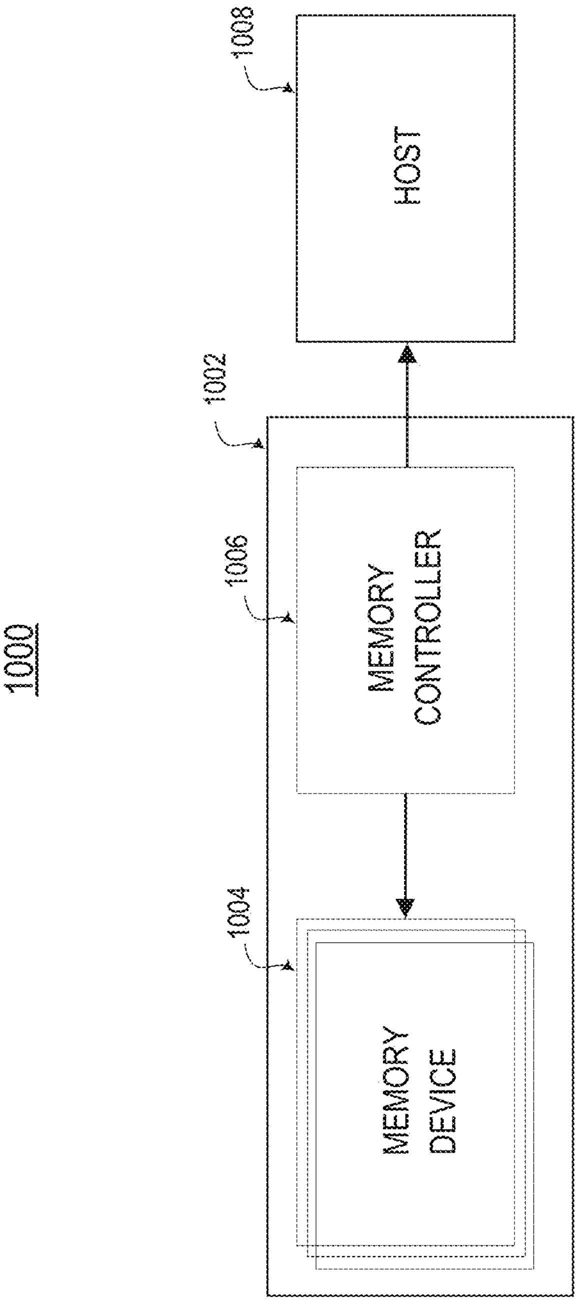
FIG. 10 is a block diagram of a memory system.

FIG. 10 is a block diagram of an illustrative system 1000. System 1000 includes a memory system 1002 that includes one or more memory devices 1004, and a memory controller 1006 that is coupled to memory devices 1004. System 1000 further includes a host 1008. Host 1008 may be a computational resource such as, but not limited to, a computer, a personal computer, a server, a microprocessor system, a microcontroller system, a multi-processor system, an industrial control system, a computer-based consumer electronics system, an artificial intelligence (AI) system, an automotive electronics system, an avionics system, an entertainment system, and so on. In illustrative system 1000, memory controller 1006 communicates with both memory devices 1004 and host 1008. Memory controller 1006 provides control signals to memory devices 1004, transfers data to be written from host 1008 to memory devices 1004, and transfers data to be read from memory devices 1004 to host 1008. In some systems, transferring data from memory devices 1004 to host 1008 is referred to as a "load" operation, and transferring data from host 1008 to memory device 1004 is referred to as a "store" operation. Memory controller 1006 may be configured to control memory operations such as read, write, and refresh operations. Memory controller 1006 may also be configured to manage various functions with respect to the data stored or to be stored in memory devices 1004 including, but not limited to, refresh and timing control, command/request translation, buffer and schedule, and power management. In some implementations, memory controller 1006 is further configured to determine the maximum memory capacity that the host 1008 can use, the number of memory banks, memory type and speed, and other parameters. Any other suitable functions may be performed by memory controller 1006 as well. Memory controller 1006 can communicate with an external device (e.g., host 1008) according to a particular communication protocol. For example, memory controller 1006 may communicate with the external device through at least one of various interface protocols, such as, but not limited to, a Universal Serial Bus (USB) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The foregoing description of the specific implementations will so reveal the general nature of the present disclosure that others can, by applying knowledge within the skill of the art, readily modify and/or adapt for various applications of such specific implementations, without undue experimentation, and without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all implementations of the present disclosure as contemplated by the inventor(s), and thus, are not intended to limit the present disclosure and the subjoined claims in any way.

The breadth and scope of the present disclosure should not be limited by any of the above-described illustrative implementations, but should be defined only in accordance with the subjoined claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device, comprising:

a plurality of first-word-lines, wherein from a top view of the memory device, each first-word-line has a first portion, a second portion, and a third portion;

a plurality of second-word-lines, wherein from the top view, each second-word-line has a first portion, a second portion, and a third portion; and a memory array having a first side, a second side laterally opposite the first side, and a third side;

wherein the first portion of each first-word-line is spaced apart from the respective third portion, and the first portion of each second-word-line is spaced apart from the respective third portion, wherein the second portion of each first-word-line is non-parallel and non-co-linear with the respective first portion and the respective third portion, and the second portion of each second-word-line is non-parallel and non-co-linear with the respective first portion and the respective third portion, wherein each first-word-line is disposed such that the respective second portion is adjacent to the first side, and each second-word-line is disposed such that the respective second portion is adjacent to the second side, wherein the first portion of each first-word-line has a first length, the second portion of each first-word-line has a second length, and the third portion of each first-word-line has a third length, wherein the first portion of each second-word-line has a fourth length, the second portion of each second-word-line has a fifth length, and the third portion of each second-word-line has a sixth length, wherein the first length is greater than the third length, and the fourth length is greater than the sixth length, wherein within the memory array, the first portion of each first-word-line extends vertically to form vertically-oriented first gate electrodes, and the first portion of each second-word-line extends vertically to form vertically-oriented second gate electrodes, and wherein from the top view, a first one of the plurality of first-word-lines is adjacent to a second one of the plurality of first-word-lines in a bit-line direction, the third portion of the first one in the plurality of first-word-lines is farther from the third side than the first portion of the first one, and the third portion of the second one in the plurality of first-word-lines is closer to the third side than the first portion of the second one.

2. The memory device of claim 1, wherein the second portion of each first-word-line is disposed within a first predetermined distance of the first side and a second predetermined distance of the second side, the first predetermined distance being less than the second predetermined distance, the second portion of each second-word-line is disposed within a third predetermined distance of the second side and a fourth predetermined distance of the first side, the third predetermined distance being less than the fourth predetermined distance, the third portion of a first first-word-line is a first distance from the third side, and the first portion of a first second-word-line is the first distance from the third side, and the third portion of a second first-word-line is a second distance from the third side, and the first portion of a second second-word-line is the second distance from the third side.

3. The memory device of claim 2, further comprising:

a plurality of first-side-word-line-pickup-structures; and a plurality of second-side-word-line-pickup-structures;

wherein each first-side-word-line-pickup-structure comprises at least the second portion of a corresponding first-word-line, a section of the first portion of the corresponding first-word-line, and a section of the third portion of the corresponding first-word-line, wherein each second-side-word-line-pickup-structure comprises at least the second portion of a corresponding second-word-line, a section of the first portion of the corresponding second-word-line, and a section of the third portion of the corresponding second-word-line.

4. The memory device of claim 3, further comprising:

a first plurality of contact structures; and a second plurality of contact structures, wherein each contact structure of the first plurality of contact structures is disposed at a corresponding first-side-word-line-pickup-structure, and each contact structure of the second plurality of contact structures is disposed at a corresponding second-side-word-line-pickup-structure.

5. The memory device of claim 2, wherein the first portion of the first first-word-line is parallel to a first portion of the first second-word-line.

6. The memory device of claim 2, wherein the first portion of each first-word-line extends laterally away from the first side of the memory array and towards the second side of the memory array.

7. The memory device of claim 6, further comprising:

a first plurality of rows of memory cells, each row of the first plurality of rows of memory cells having a plurality of memory cells;

wherein the first portion of each is coupled to the plurality of memory cells of a corresponding row of the first plurality of rows of memory cells.

8. The memory device of claim 7, wherein the first portion of each second-word-line extends laterally away from the second side of the memory array and towards the first side of the memory array.

9. The memory device of claim 8, further comprising:

a second plurality of rows of memory cells, each row of the second plurality of rows of memory cells having a plurality of memory cells;

wherein the first portion of each second-word-line is coupled to the plurality of memory cells of a corresponding row of the second plurality of rows of memory cells.

10. The memory device of claim 8, wherein the third portion of each first-word-line extends away from the first side of the memory array and towards the second side of the memory array, and the third portion of each second-word-line extends away from the second side of the memory array and towards the first side of the memory array.

11. The memory device of claim 1, wherein each of the plurality of first-word-lines is disposed within the memory array, and each of the plurality of second-word-lines is disposed within the memory array.

12. The memory device of claim 1, further comprising:

a first-side-word-line-pickup-structure that comprises the second portion of a corresponding first-word-line, a section of the first portion of the corresponding first-word-line, and a section of the third portion of the corresponding first-word-line.

13. The memory device of claim 12, wherein another section of the third portion of the corresponding first-word-line is outside the first-side-word-line-pickup-structure.

14. The memory device of claim 1, wherein from the top view, the third portion of the first one in the plurality of first-word-lines and the third portion of the second one in the plurality of first-word-lines are adjacent to each other in a bit-line direction.

15. The memory device of claim 14, wherein from the top view, the first portion of the first one in the plurality of first-word-lines is aligned with the third portion of a second-word-line of the plurality of second-word-lines, in a word-line direction perpendicular to the bit-line direction, at least one dielectric material being arranged between the first portion of the first one and the third portion of the second-word-line.

16. The memory device of claim 15, wherein the at least one dielectric material is disposed within the memory array.

17. The memory device of claim 1, wherein from the top view, the vertically-oriented first gate electrodes and the vertically-oriented second gate electrodes are arranged into a plurality of memory rows.

18. The memory device of claim 1, wherein from the top view, the vertically-oriented first gate electrodes are arranged into first memory rows, and the vertically-oriented second gate electrodes are arranged into second memory rows, and the first memory rows and the second memory rows are arranged in an alternating manner.

19. The memory device of claim 1, wherein from the top view, the first portion of the first one in the plurality of first-word-lines is aligned with the third portion of a second-word-line of the plurality of second-word-lines, in a word-line direction, across a gap filled with at least one dielectric material; and in a bit-line direction perpendicular to the word-line direction, the gap filled with the at least one dielectric material corresponds to a vertically-oriented second gate electrode of the vertically-oriented second gate electrodes in the second-word-line.

20. The memory device of claim 1, wherein from the top view, a spacing between the third portion of the first one and the third portion of the second one is less than a spacing between the third portion of the first one and the first portion of the second one, and is less than a spacing between the first portion of the first one and the first portion of the second one.

* * * * *